(12) United States Patent
Mayumi

(10) Patent No.: US 12,063,426 B2
(45) Date of Patent: Aug. 13, 2024

(54) IMAGING UNIT AND IMAGING DEVICE

(71) Applicant: FUJIFILM Corporation, Tokyo (JP)

(72) Inventor: Kazuya Mayumi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 615 days.

(21) Appl. No.: 17/183,732

(22) Filed: Feb. 24, 2021

(65) Prior Publication Data

US 2021/0185195 A1    Jun. 17, 2021

Related U.S. Application Data

(63) Continuation of application No. PCT/JP2019/032894, filed on Aug. 22, 2019.

(30) Foreign Application Priority Data

Aug. 31, 2018  (JP) .................................. 2018-163210

(51) Int. Cl.
*H04N 23/54*    (2023.01)
*H01L 27/146*   (2006.01)

(52) U.S. Cl.
CPC ....... *H04N 23/54* (2023.01); *H01L 27/14634* (2013.01)

(58) Field of Classification Search
CPC .......................... H04N 23/54; H01L 27/14634
USPC ....................................................... 257/431
See application file for complete search history.

(56) References Cited

U.S. PATENT DOCUMENTS

| | | | |
|---|---|---|---|
| 9,165,961 B2 * | 10/2015 | Iwama | .............. H01L 27/14618 |
| 2002/0057558 A1 | 5/2002 | Barrow | |
| 2003/0155639 A1 | 8/2003 | Nakamura et al. | |
| 2008/0237768 A1 | 10/2008 | Yajima et al. | |
| 2012/0104536 A1 | 5/2012 | Seo et al. | |
| 2015/0054112 A1 | 2/2015 | Iwama et al. | |

(Continued)

FOREIGN PATENT DOCUMENTS

| | | |
|---|---|---|
| CN | 1185892 A | 6/1998 |
| CN | 101005062 A | 7/2007 |

(Continued)

OTHER PUBLICATIONS

An Office Action; "Notice of Reasons for Refusal," mailed by the Japanese Patent Office on Jun. 8, 2021, which corresponds to Japanese Patent Application No. 2020-539394 and is related to U.S. Appl. No. 17/183,732 with English language translation.

(Continued)

*Primary Examiner* — Tu-Tu V Ho
(74) *Attorney, Agent, or Firm* — Studebaker & Brackett PC

(57) ABSTRACT

An imaging unit (50) includes an imaging sensor chip (1), a package substrate (2) on which the imaging sensor chip (1) is mounted, an adhesion member (5) that adheres a back surface of the imaging sensor chip (1) opposite to a light receiving surface (10) and a bottom surface (2d) that is a surface of the package substrate (2) on which the imaging sensor chip (1) is mounted to each other, and a circuit board (52) that is adhered to a back surface of the package substrate (2) opposite to the bottom surface (2d). The adhesion member (5) is composed of a central adhesion part (5a) adhered to a central portion (1A) of the imaging sensor chip (1) and a peripheral adhesion part (5b) adhered to a peripheral portion (1B) of the imaging sensor chip (1) that is separated from the central portion (1A).

10 Claims, 21 Drawing Sheets

(56) References Cited

U.S. PATENT DOCUMENTS

| | | |
|---|---|---|
| 2015/0325611 A1* | 11/2015 | Jun .................. H01L 23/04 257/434 |
| 2017/0345862 A1 | 11/2017 | Kinsman et al. |
| 2018/0175089 A1 | 6/2018 | Mada |
| 2019/0035836 A1 | 1/2019 | Watanabe et al. |

FOREIGN PATENT DOCUMENTS

| | | |
|---|---|---|
| JP | H05-224109 A | 9/1993 |
| JP | 2003-243637 A | 8/2003 |
| JP | 2004-335628 A | 11/2004 |
| JP | 2006-269784 A | 10/2006 |
| JP | 2008-098262 A | 4/2008 |
| JP | 2012-095177 A | 5/2012 |
| JP | 2015-032653 A | 2/2015 |
| JP | 2015-046435 A | 3/2015 |
| JP | 2017-139258 A | 8/2017 |
| TW | 201806139 A | 2/2018 |
| WO | 2016/132883 A1 | 8/2016 |

OTHER PUBLICATIONS

International Search Report issued in PCT/JP2019/032894; mailed Nov. 5, 2019.
International Preliminary Report on Patentability issued in PCT/JP2019/032894; completed Jul. 8, 2020.
An Office Action mailed by China National Intellectual Property Administration on Nov. 14, 2023, which corresponds to Chinese Patent Application No. 201980056441.4 and is related to U.S. Appl. No. 17/183,732; with English language translation.

* cited by examiner

VERIFICATION EXAMPLE C

VERIFICATION EXAMPLE E

VERIFICATION EXAMPLE A

VERIFICATION EXAMPLE D

VERIFICATION EXAMPLE F

VERIFICATION EXAMPLE B

IMAGING UNIT AND IMAGING DEVICE

CROSS REFERENCE TO RELATED APPLICATION

This is a continuation of International Application No. PCT/JP2019/032894 filed on Aug. 22, 2019, and claims priority from Japanese Patent Application No. 2018-163210 filed on Aug. 31, 2018, the entire disclosures of which are incorporated herein by reference.

BACKGROUND OF THE INVENTION

1. Field of the Invention

The present invention relates to an imaging unit and an imaging device.

2. Description of the Related Art

Recently, there has been a rapid increase in demand for an information device having an imaging function, such as a digital still camera, a digital video camera, a portable telephone such as a smartphone, a tablet terminal, and an endoscope in accordance with an increase in resolution of an imaging sensor such as a charge coupled device (CCD) image sensor or a complementary metal oxide semiconductor (CMOS) image sensor. An electronic device having an imaging function as described above is referred to as an imaging device.

The imaging device comprises an imaging unit including an imaging sensor chip that is a semiconductor chip, a package that houses the imaging sensor chip, and a circuit board on which the package is mounted.

JP2017-139258A discloses a configuration in which a central portion of a back surface of an imaging sensor chip and a package substrate are adhered to each other, and a configuration in which four corner portions on a light receiving surface side of the imaging sensor chip and the package substrate are adhered to each other.

JP2008-098262A discloses a configuration in which a concave portion is formed on a mounting surface of a package substrate on which an imaging sensor chip is mounted, and the imaging sensor chip and the package substrate are adhered to each other by an adhesive packed in the concave portion.

SUMMARY OF THE INVENTION

In a case where the package substrate that houses the semiconductor chip is mounted on the circuit board, the unit is placed in a high temperature in a step of electrically connecting the package substrate and the circuit board to each other with a solder. In a case where the temperature of the unit decreases after completion of this step, a warpage due to a bimetal effect occurs due to a difference in linear expansion coefficients of components of the unit.

In a case where the semiconductor chip is an imaging sensor chip, a flatness of a light receiving surface of the imaging sensor chip cannot be ensured due to a warpage caused by a bimetal effect. In a case where the light receiving surface warps in this way, a focus shifts around the light receiving surface, which affects an image quality. In a case where a size of the imaging sensor chip is large, for example, a full size, it is particularly important to take measures against a warpage due to a bimetal effect. JP2017-139258A and JP2008-098262A do not recognize such a problem of the warpage of the imaging sensor chip.

The present invention has been made in view of the above circumstances, and an object of the present invention is to provide an imaging unit capable of improving an image quality by preventing a warpage of an imaging sensor chip, and an imaging device comprising the imaging unit.

An imaging unit according to an aspect of the present invention comprises: an imaging sensor chip; a package substrate on which the imaging sensor chip is mounted; an adhesion member that adheres a back surface of a light receiving surface of the imaging sensor chip and a mounting surface of the package substrate on which the imaging sensor chip is mounted to each other; and a circuit board that is adhered to a back surface of the mounting surface of the package substrate. The adhesion member includes a central adhesion part adhered to a central portion of the imaging sensor chip and a peripheral adhesion part adhered to a peripheral portion of the imaging sensor chip that is separated from the central portion. The peripheral portion is an annular region extending along a peripheral edge of the image element chip.

An imaging device of an aspect of the present invention comprises: the above-described imaging unit.

According to the present invention, it is possible to provide an imaging unit capable of improving an image quality by preventing a warpage of an imaging sensor, and an imaging device comprising the imaging unit.

DESCRIPTION OF THE PREFERRED EMBODIMENTS

Figure 1:
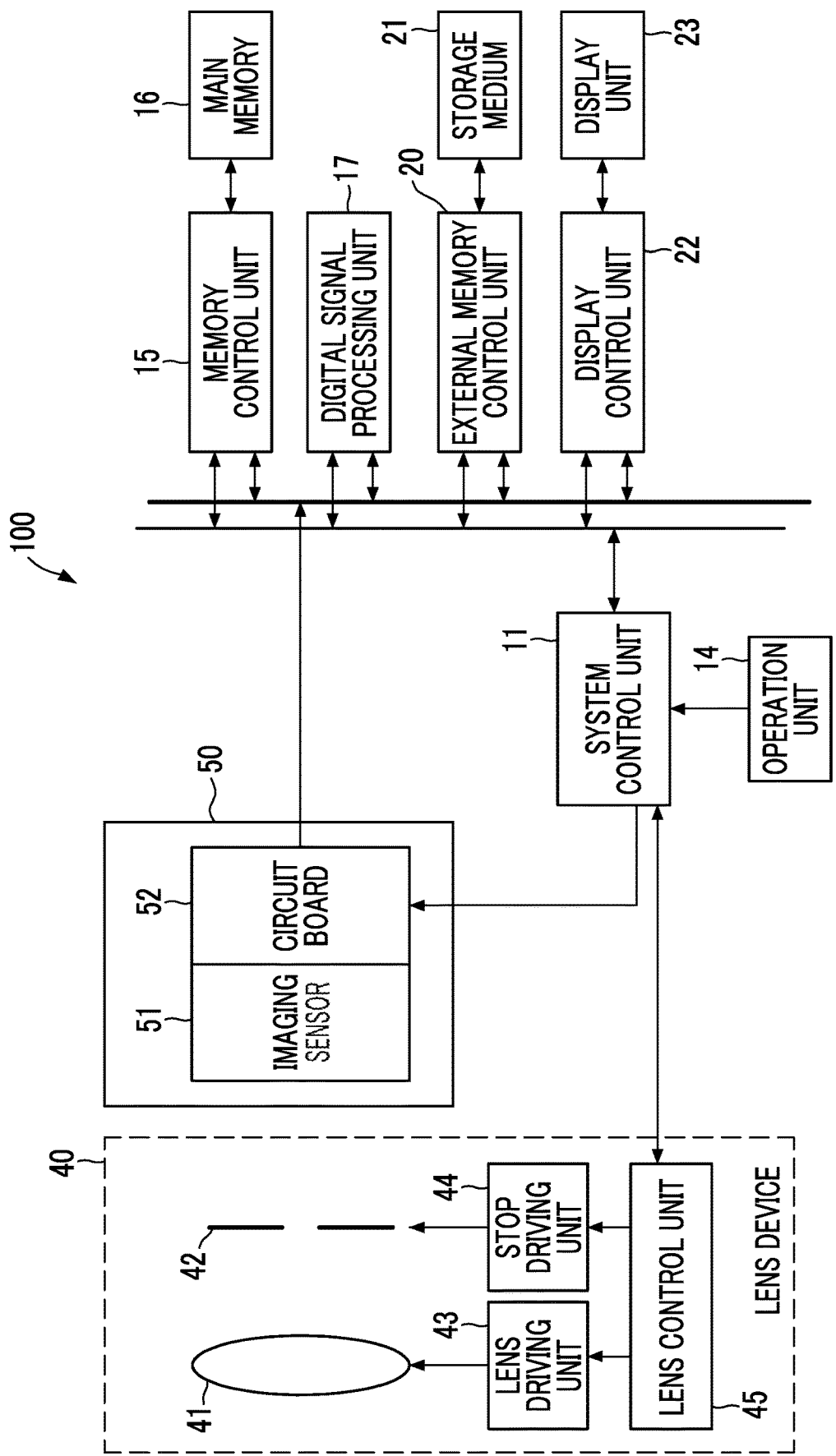
FIG. 1 is a diagram showing a schematic configuration of a digital camera 100 that is an embodiment of an imaging device of the present invention.

FIG. 1 is a diagram showing a schematic configuration of a digital camera 100 that is an embodiment of an imaging device of the present invention.

The digital camera 100 shown in FIG. 1 comprises a lens device 40 including an imaging lens 41, a stop 42, a lens driving unit 43, a stop driving unit 44, and a lens control unit 45.

The lens device 40 may be attachable to and detachable from a main body of the digital camera 100, or may be integrated with the main body of the digital camera 100.

The imaging lens 41 includes a focus lens or a zoom lens that can move in an optical axis direction.

The lens control unit 45 of the lens device 40 is configured to be able to communicate with a system control unit 11 of the digital camera 100 by wire or wireless means.

According to a command from the system control unit 11, the lens control unit 45 changes a position of a principal point of the focus lens by driving the focus lens included in the imaging lens 41 via the lens driving unit 43, or controls the aperture amount of the stop 42 via the stop driving unit 44.

The digital camera 100 further comprises an imaging unit 50 for imaging a subject through an imaging optical system, the system control unit 11, and an operation unit 14.

The imaging unit 50 comprises an imaging sensor 51 such as a CCD image sensor or a CMOS image sensor, and a circuit board 52 on which the imaging sensor 51 is mounted.

The imaging sensor 51 has a light receiving surface (light receiving surface 10 in FIG. 3 which will be described below) on which a plurality of pixels are two-dimensionally arranged, and converts an image of the subject formed on the light receiving surface 10 by the imaging optical system into an electric signal (pixel signal) by the plurality of pixels and outputs the electric signal.

The system control unit 11 drives the imaging sensor 51 to output the image of the subject captured through the imaging optical system of the lens device 40 as a captured image signal. A command signal from a user is input to the system control unit 11 through the operation unit 14.

The system control unit 11 collectively controls the entire digital camera 100, and has a hardware structure of various processors that execute programs to perform processing.

The various processors include a central processing unit (CPU) that is a general-purpose processor executing a program to perform various types of processing, a programmable logic device (PLD) that is a processor of which a circuit configuration can be changed after manufacturing such as a field programmable gate array (FPGA), or a dedicated electric circuit that is a processor having a circuit configuration designed to be dedicated to executing specific processing such as an application specific integrated circuit (ASIC). More specifically, structures of the various processors are electric circuits in which circuit elements such as semiconductor elements are combined.

The system control unit 11 may be constituted by one of the various processors, or may be constituted by a combination of two or more processors of the same type or different types (for example, a combination of a plurality of FPGAs or a combination of a CPU and an FPGA).

Further, an electric control system of the digital camera 100 comprises a main memory 16 constituted by a random access memory (RAM), a memory control unit 15 that controls data storage in the main memory 16 and data read from the main memory 16, a digital signal processing unit 17 that performs digital signal processing on the captured image signal output from the imaging unit 50 to generate captured image data according to various formats such as a joint photographic experts group (JPEG) format, an external memory control unit 20 that controls data storage in a storage medium 21 and data read from the storage medium 21, a display unit 23 that is constituted by an organic electroluminescence (EL) display or a liquid crystal display, and a display control unit 22 that controls a display on the display unit 23.

Figure 2:
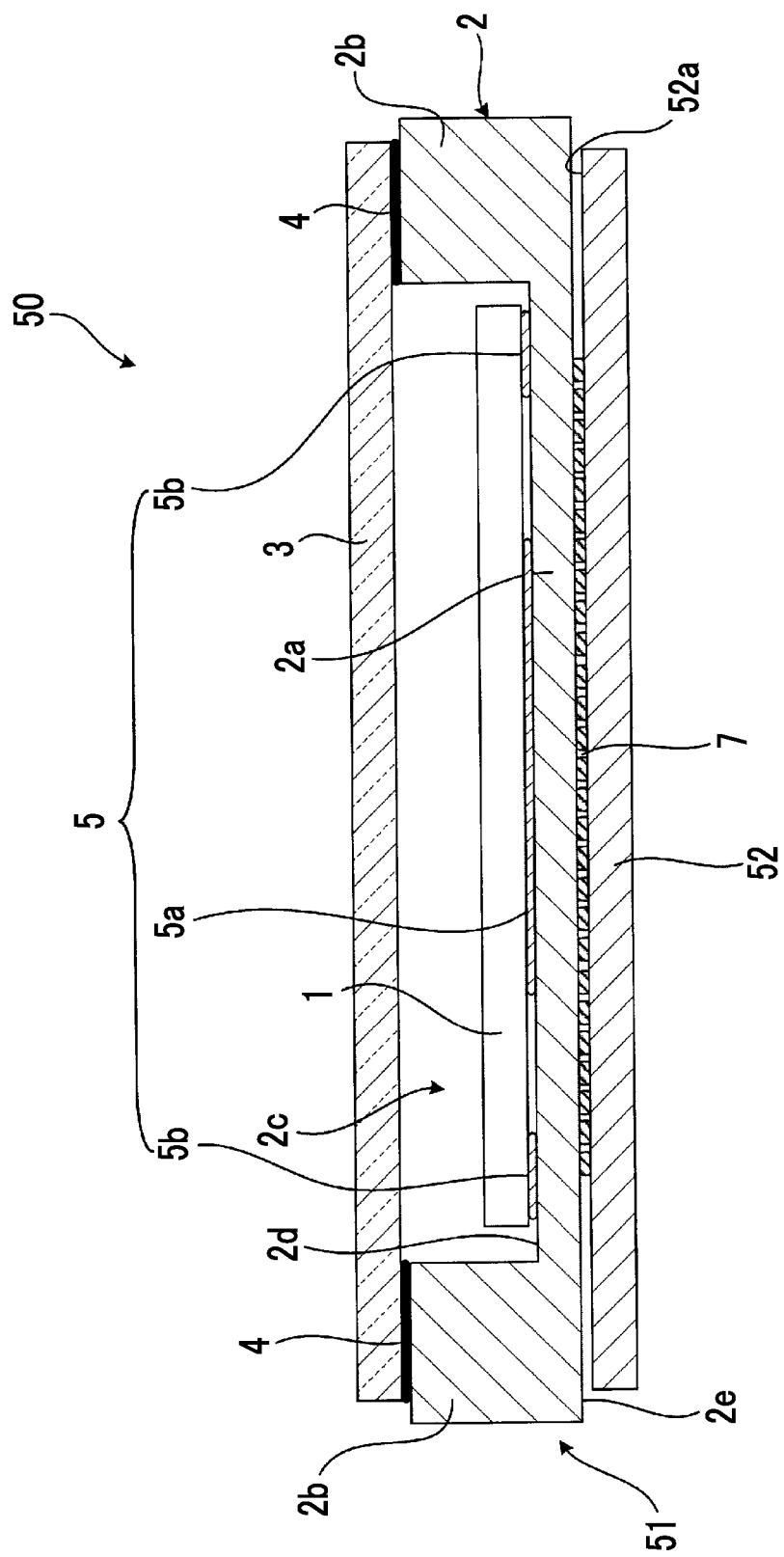
FIG. 2 is a schematic cross-sectional view of an imaging unit 50 in the digital camera 100 shown in FIG. 1.
Figure 3:
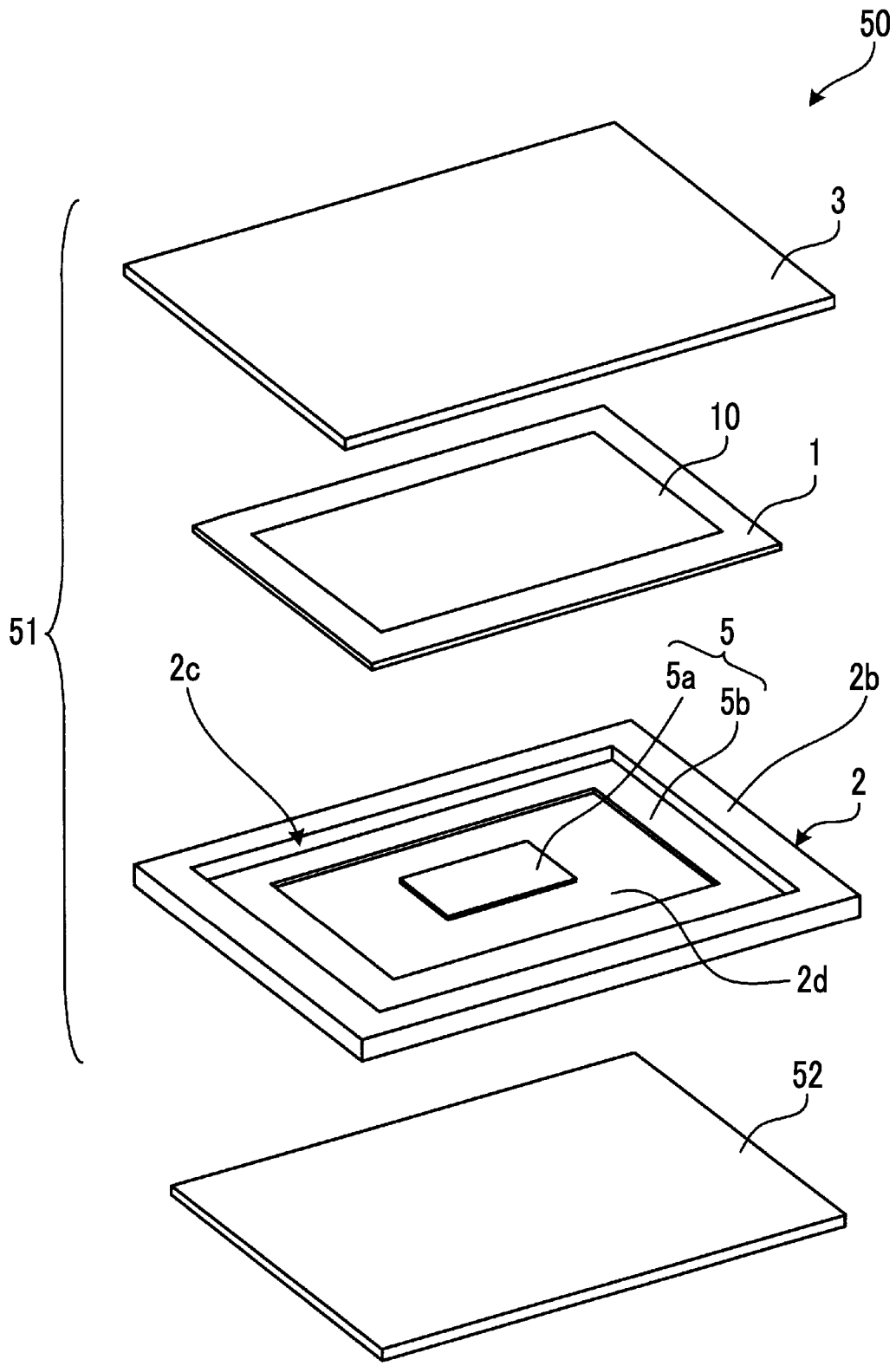
FIG. 3 is an exploded perspective view schematically showing the imaging unit 50 in the digital camera 100 shown in FIG. 1.

FIG. 2 is a schematic cross-sectional view of the imaging unit 50 in the digital camera 100 shown in FIG. 1. FIG. 3 is an exploded perspective view schematically showing the imaging unit 50 in the digital camera 100 shown in FIG. 1.

As shown in FIGS. 2 and 3, the imaging unit 50 comprises the imaging sensor 51 and the circuit board 52 adhered to a rear surface of the imaging sensor 51.

The imaging sensor 51 comprises a package substrate 2 that has a bottom portion 2a having a plate shape such as a rectangular plate shape or a circular plate shape (rectangular plate shape in the examples of FIGS. 2 and 3) and a wall portion 2b erected at an end of the bottom portion 2a and having a frame shape such as a rectangular frame shape or a circular frame shape (rectangular frame shape in the examples of FIGS. 2 and 3). The package substrate 2 is configured to have a concave portion 2c in a portion surrounded by the wall portion 2b.

The imaging sensor 51 further comprises an imaging sensor chip 1 fixed to a bottom surface 2d of the concave portion 2c of the package substrate 2, and a protective cover 3 constituted by a light-transmissive member such as a resin or a glass, the protective cover 3 being fixed to an upper surface of the wall portion 2b of the package substrate 2 by an adhesive 4 and sealing the imaging sensor chip 1 by closing the concave portion 2c of the package substrate 2. The bottom surface 2d of the package substrate 2 constitutes a mounting surface on which the imaging sensor chip 1 is mounted.

The imaging sensor chip 1 is a semiconductor chip including a photoelectric conversion element such as a photodiode, and a light receiving surface 10 on which a readout circuit that converts charges accumulated in the photoelectric conversion element into signals and read out the signals is formed. The imaging sensor chip 1 has a rectangular planar shape and is adhered to the bottom surface 2d of the package substrate 2 by an adhesion member 5 such as a resin used as a die bonding material. A semiconductor substrate of the imaging sensor chip 1 is made of, for example, silicon.

Although the details will be described below, the adhesion member 5 is composed of a central adhesion part 5a adhered to a central portion of the imaging sensor chip 1 and a peripheral adhesion part 5b adhered to a peripheral portion in the imaging sensor chip 1 that is separated from the central portion. A linear expansion coefficient of the adhesion member 5 is larger than that of the package substrate 2 and the circuit board 52.

The package substrate 2 is constituted by an insulating material such as alumina ceramic, or has a multilayer structure in which a conductive layer formed of a conductive member such as tungsten and an insulating layer formed of an insulating material such as alumina ceramic are laminated. A linear expansion coefficient of the package substrate 2 is larger than a linear expansion coefficient of the imaging sensor chip 1.

A large number of terminals (not shown) are formed on the bottom surface 2d of the concave portion 2c of the package substrate 2, and these terminals are electrically connected to electrode pads formed on the imaging sensor chip 1 by conductive wires (not shown). Further, terminals that are electrically connected to the terminals formed on the bottom surface 2d of the concave portion 2c of the package substrate 2 are exposed on the rear surface 2e of the package substrate 2 opposite to the side to which the protective cover 3 is fixed.

The circuit board 52 is adhered and fixed to the rear surface 2e of the package substrate 2 by a plurality of conductive members 7. The conductive member 7 is in contact with each of the plurality of terminals exposed on the rear surface 2e of the package substrate 2.

The conductive member 7 may be constituted by a conductive material having an adhesion function, and for example, a solder formed of an alloy of lead and tin or a solder formed of an alloy of tin and copper is used.

The circuit board 52 is a plate-shaped member. On the circuit board 52, a circuit for driving the imaging sensor chip 1, a circuit for processing a signal output from the imaging sensor chip 1, and the like are formed. On a surface 52a of the circuit board 52 on the side adhered to the package substrate 2, terminals of these circuits are formed at positions in contact with the conductive member 7. Therefore, the terminal of the circuit included in the circuit board 52 and the terminal formed on the rear surface of the package substrate 2 are electrically connected to each other by the conductive member 7.

The circuit board 52 is constituted of, for example, a glass epoxy resin and copper, and a linear expansion coefficient thereof is larger than the linear expansion coefficient of the package substrate 2. A difference in the linear expansion coefficient between the circuit board 52 and the package substrate 2 is a main factor that causes a warpage of the imaging sensor chip 1 due to the above-described bimetal effect.

Figure 4:
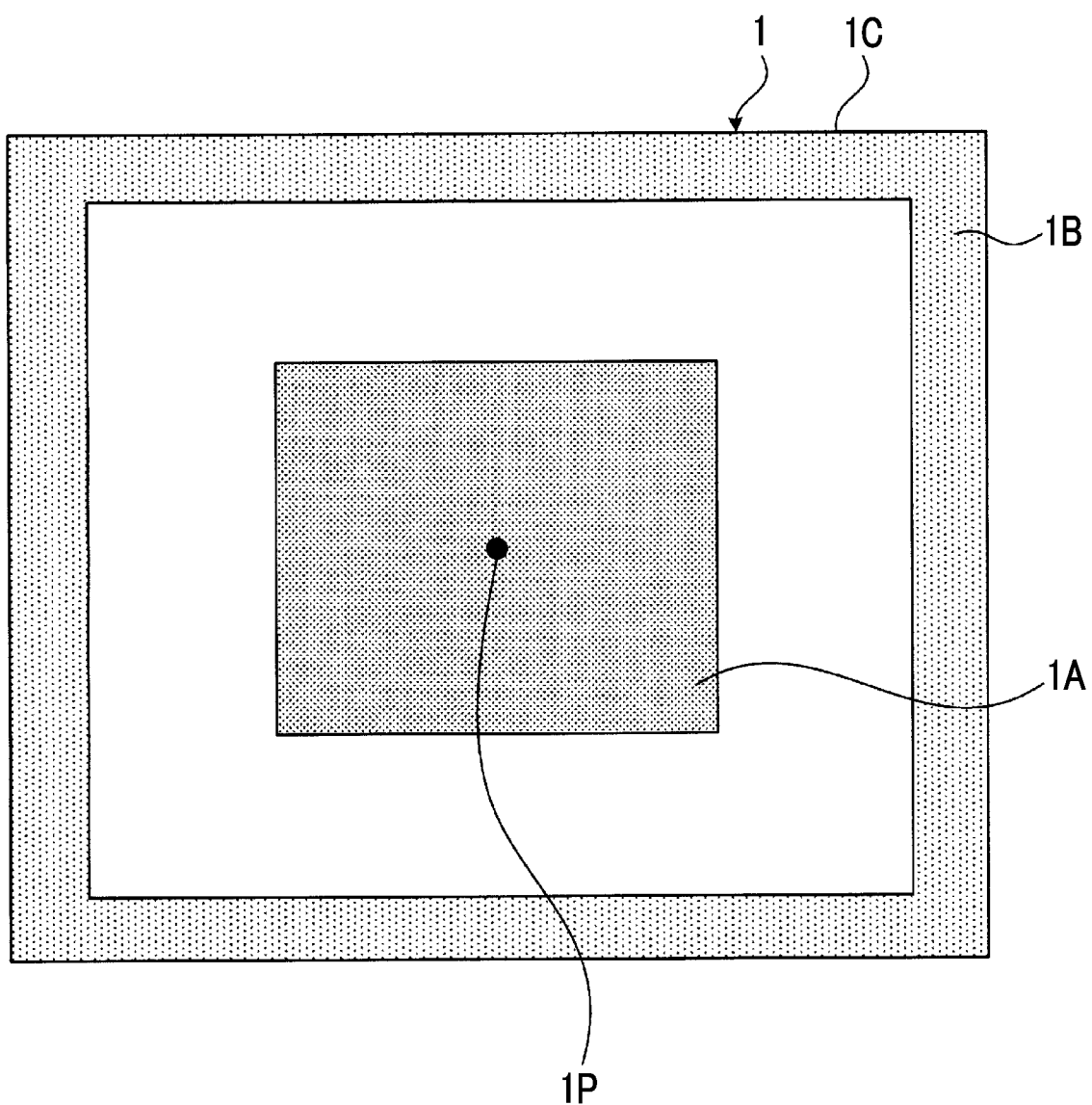
FIG. 4 is a schematic plan view of an imaging sensor chip 1 of the imaging unit 50 shown in FIGS. 2 and 3 as viewed from a back surface side of the imaging sensor chip 1 opposite to a light receiving surface 10 in a direction perpendicular to the light receiving surface 10.

FIG. 4 is a schematic plan view of the imaging sensor chip 1 of the imaging unit 50 shown in FIGS. 2 and 3 as viewed from a back surface side of the imaging sensor chip 1 opposite to a light receiving surface 10 in a direction perpendicular to the light receiving surface 10. FIG. 4 shows a central portion 1A of the imaging sensor chip 1 adhered to the central adhesion part 5a of the adhesion member 5, a peripheral portion 1B of the imaging sensor chip 1 adhered to the peripheral adhesion part 5b of the adhesion member 5, a peripheral edge 1C of the imaging sensor chip 1, and the center 1P of the imaging sensor chip 1. The center 1P coincides with the center of the light receiving surface 10.

The central portion 1A is a region such as a rectangular shape, a polygonal shape, or a circular shape centered on the center 1P on the back surface of the imaging sensor chip 1. In the example of FIG. 4, the central portion 1A has a rectangular shape. It is desired that the central portion 1A is a region of line symmetry with respect to a straight line passing through the center 1P and extending in the direction along the long side of the imaging sensor chip 1, and with respect to a straight line passing through the center 1P and extending in the direction along the short side of the imaging sensor chip 1.

The peripheral portion 1B is a region on the back surface of the imaging sensor chip 1 that is separated from the central portion 1A and is adjacent to the peripheral edge 1C. In the example of FIG. 4, the peripheral portion 1B is an annular (square frame shape in the example of FIG. 4) region extending along the peripheral edge 1C, and an outer peripheral edge of the peripheral portion 1B coincides with the peripheral edge 1C.

As a result of verification, the inventor found that a warpage of the imaging sensor chip 1 caused by the bimetal effect can be reduced by constituting the adhesion member 5 in the imaging unit 50 by the central adhesion part 5a adhered to the central portion 1A having the configuration described above and the peripheral adhesion part 5b adhered to the peripheral portion 1B having the configuration described above.

In a case where the central portion 1A and the peripheral portion 1B of the imaging sensor chip 1 are adhered to the package substrate 2 by the adhesion member 5, an adhesion region adhered to the package substrate 2, a non-adhesion region not adhered to the package substrate 2, and an adhesion region adhered to the package substrate 2 are arranged on the back surface of the imaging sensor chip 1 from the center 1P toward the peripheral edge 1C.

A warpage of the imaging sensor chip 1 can be caused by being adhered to the package substrate 2. That is, the adhesion member 5 itself causes stress that can cause a warpage.

In fact, it is clarified from simulation results of FIG. 18 which will be described below that the amount of warpage of the imaging sensor chip 1 at a position apart from the center 1P by a predetermined distance r is proportional to the square of the predetermined distance r in the adhesion region (central portion 1A and peripheral portion 1B) adhered to the package substrate 2, and is proportional to the predetermined distance r in the non-adhesion region (portion other than central portion 1A and peripheral portion 1B) not adhered to the package substrate 2.

In the imaging sensor chip 1, in a case where an image height at a position of a peripheral edge of the light receiving surface 10 from the center 1P of the imaging sensor chip 1 is defined as a reference image height, it is important to reduce the amount of warpage at a position where an image height is about 50% of the reference image height and the amount of warpage at a position where an image height is about 80% of the reference image height, in order to prevent deterioration in quality of a captured image.

Therefore, the deterioration in quality of the captured image can be most effectively prevented by providing no adhesion region between a position where an image height is about 50% of the reference image height and a position where an image height is about 80% of the reference image height. Specifically, the central portion 1A shown in FIG. 4 is preferably a region inside (center 1P side) a position where an image height is 45% or less of the reference image height, and the peripheral portion 1B shown in FIG. 4 is preferably a region from a position where an image height is 85% or more of the reference image height to the peripheral edge 1C of the imaging sensor chip 1.

In addition, as a result of verification, the inventor found that a warpage of the imaging sensor chip 1 caused by the bimetal effect can be reduced by using the peripheral portion 1B shown in FIG. 4 as four corner portions of the imaging sensor chip 1 instead of the annular region surrounding the central portion 1A. The corner portion of the imaging sensor chip 1 refers to a region such as a rectangular shape, a polygonal shape, or a circular shape that is adjacent to the corner of the peripheral edge 1C and is in contact with two sides of the peripheral edge 1C extending from this corner.

Figure 5:
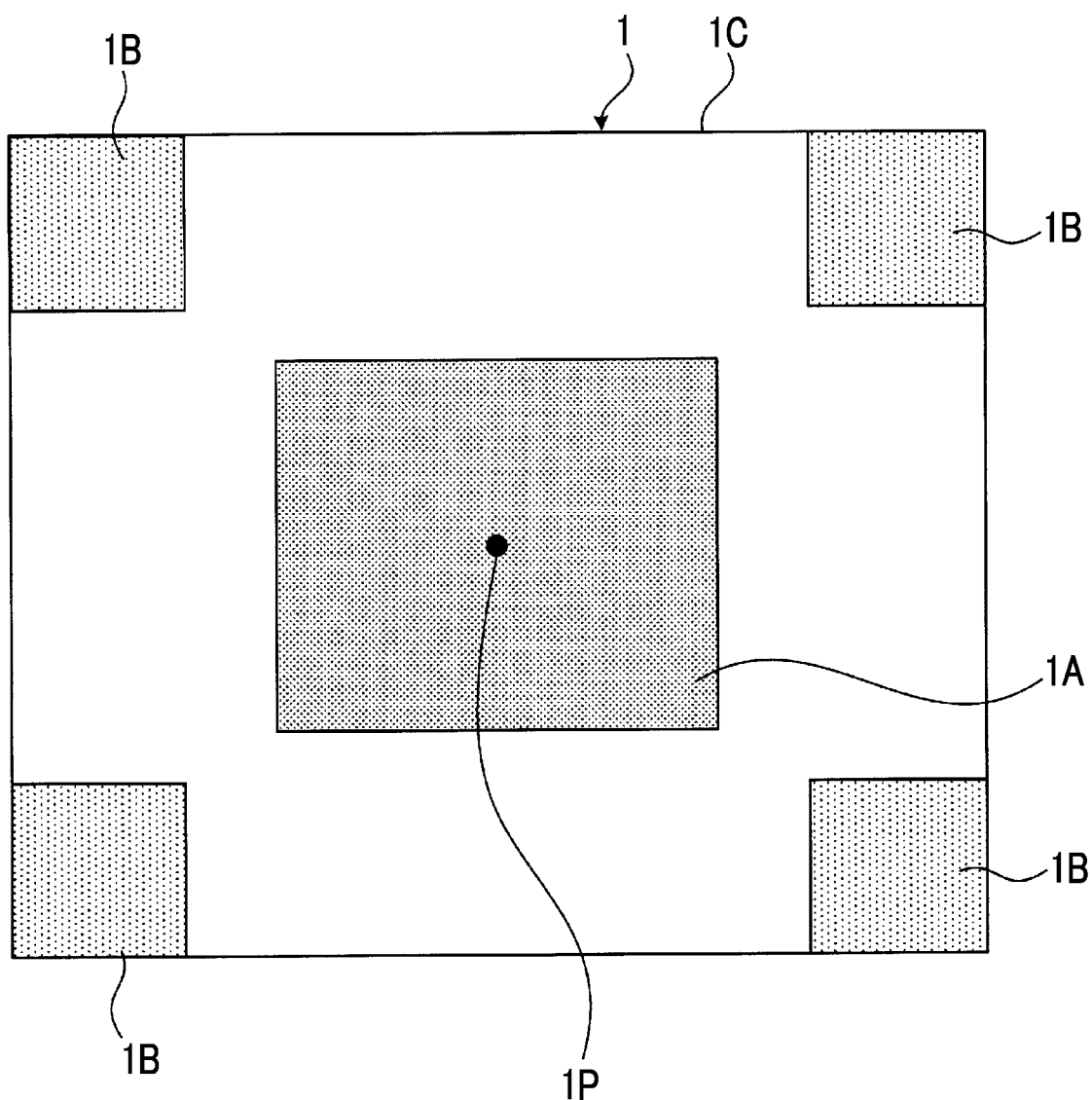
FIG. 5 is a diagram showing a first modification example of the shape of a peripheral portion 1B shown in FIG. 4.

FIG. 5 is a diagram showing a first modification example of the shape of the peripheral portion 1B shown in FIG. 4. In the example shown in FIG. 5, each of the four corner portions of the imaging sensor chip 1 is the peripheral portion 1B. FIG. 5 shows an example in which the corner portion of the imaging sensor chip 1 has a rectangular shape including the corner of the peripheral edge 1C.

Figure 6:
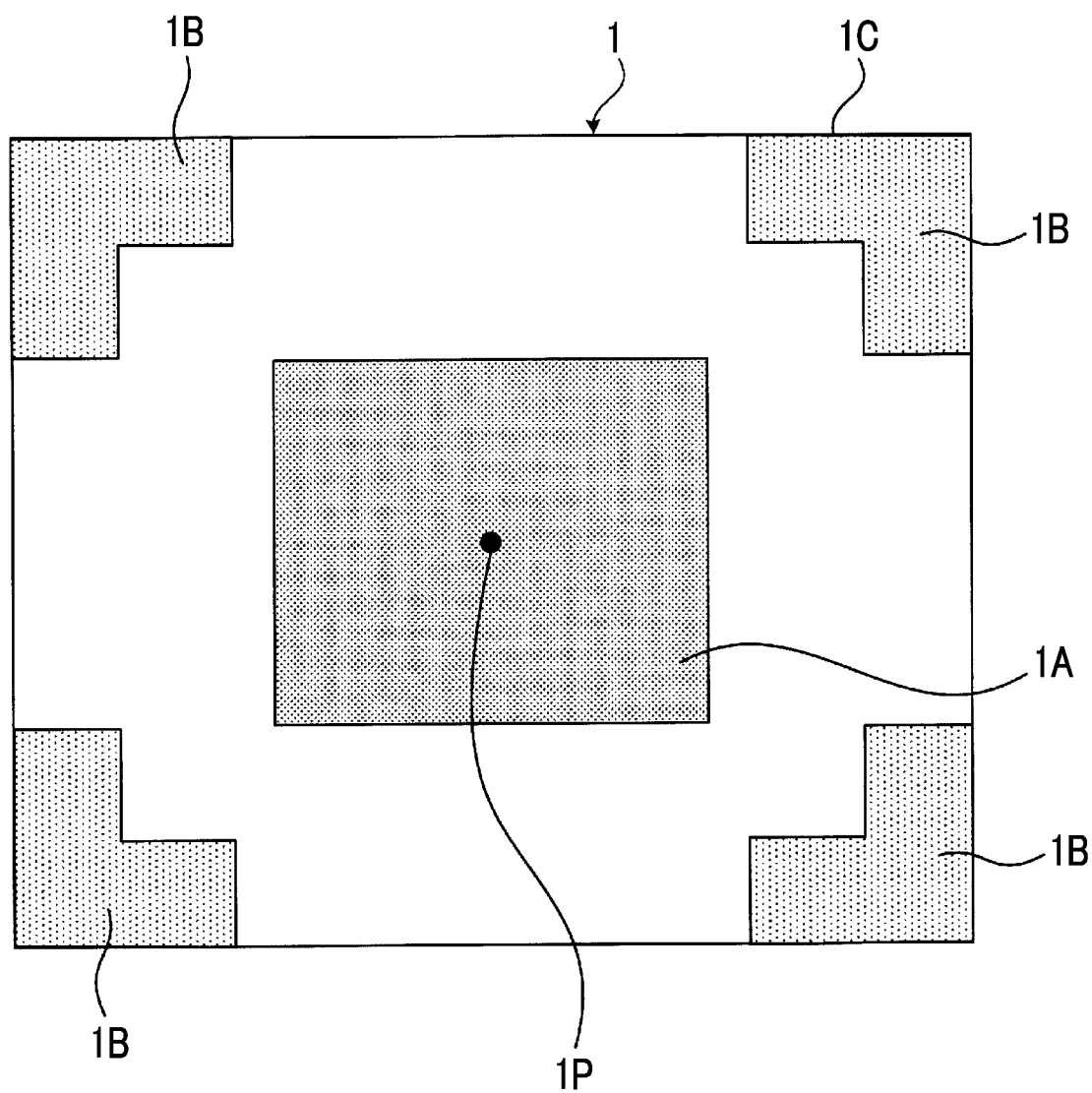
FIG. 6 is a diagram showing a second modification example of the shape of a peripheral portion 1B shown in FIG. 4.

FIG. 6 is a diagram showing a second modification example of the shape of the peripheral portion 1B shown in FIG. 4. In the example shown in FIG. 6, each of the four corner portions of the imaging sensor chip 1 is the peripheral portion 1B. FIG. 6 shows an example in which the corner portion of the imaging sensor chip 1 has an L shape including the corner of the peripheral edge 1C.

In the modification examples shown in FIGS. 5 and 6, the peripheral portions 1B are separated from each other, and a non-adhesion region is present between the adjacent peripheral portions 1B. Therefore, at a position where an image height is 80% of the reference image height, a range in which the adhesion region is present can be made smaller than that in the example shown in FIG. 4. For this reason, the deterioration in quality of the captured image can be most effectively prevented by making an adhesion region not present at least at a position where an image height is about 50% of the reference image height.

Specifically, the central portion 1A shown in FIGS. 5 and 6 is preferably a region inside a position where an image height is 45% or less of the reference image height, and the peripheral portion 1B shown in FIGS. 5 and 6 is preferably provided in a region between a position where an image height is 55% of the reference image height and the peripheral edge 1C of the imaging sensor chip 1.

In addition, it is preferable that a total value of areas of the four peripheral portions 1B shown in FIGS. 5 and 6 is the same as an area of the peripheral portion 1B shown in FIG. 4. As described above, since the peripheral portion 1B shown in FIG. 4 is a region from a position where an image height is 85% or more of the reference image height to the peripheral edge 1C of the imaging sensor chip 1, the total value of the areas of the four peripheral portions 1B shown in FIGS. 5 and 6 is preferably the same as an area of a region from the peripheral edge 1C to a position where an image height is 85% or more of the reference image height.

Hereinafter, results of verifying the amount of warpage of the imaging sensor chip 1 in the imaging unit 50 by simulation using a finite element method will be described.

Figure 7:
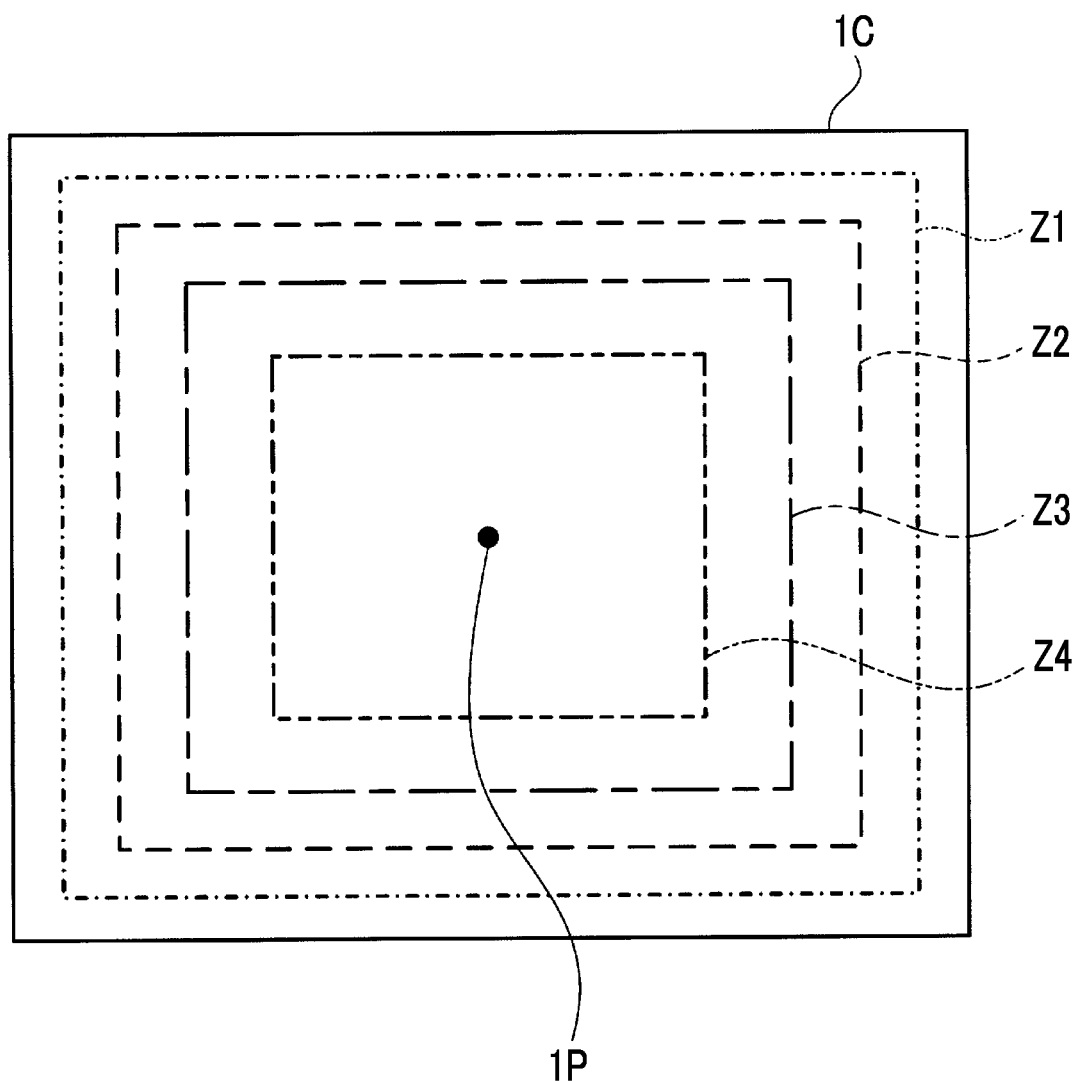
FIG. 7 is a schematic view for describing an image height set on the back surface of the imaging sensor chip 1 in a simulation.

FIG. 7 is a schematic view for describing an image height set on the back surface of the imaging sensor chip 1 in a simulation. In this simulation, an image height at a position of a peripheral edge of the light receiving surface 10 from the center 1P of the imaging sensor chip 1 is defined as a reference image height.

An image height at a position of the peripheral edge 1C of the imaging sensor chip 1 is 103% of the reference image height. An image height at a position of a rectangular frame Z1 shown in FIG. 7 is 92% of the reference image height. An image height at a position of a rectangular frame Z2 shown in FIG. 7 is 80% of the reference image height. An image height at a position of a rectangular frame Z3 shown in FIG. 7 is 65% of the reference image height. An image height at a position of a rectangular frame Z4 shown in FIG. 7 is 45% of the reference image height.

Outer shapes of the peripheral edge 1C, the light receiving surface 10, the rectangular frame Z1, the rectangular frame Z2, the rectangular frame Z3, and the rectangular frame Z4 have similar shapes centered on the center 1P. An area of a region inside the rectangular frame Z4 on the back surface of the imaging sensor chip 1, an area of a region between the rectangular frame Z4 and the rectangular frame Z3 on the back surface of the imaging sensor chip 1, an area of a region between the rectangular frame Z3 and the rectangular frame Z2 on the back surface of the imaging sensor chip 1, an area of a region between the rectangular frame Z2 and the rectangular frame Z1 on the back surface of the imaging sensor chip 1, and an area of a region between the rectangular frame Z1 and the peripheral edge 1C on the back surface of the imaging sensor chip 1 are the same as one another.

The amount of warpage of the imaging sensor chip 1 was simulated for verification examples A and B corresponding to the configuration shown in FIG. 4, verification examples C and D corresponding to the configuration shown in FIG. 5, verification examples E and F corresponding to the configuration shown in FIG. 6, and comparative verification examples G1 to G4 as the configuration of the region adhered to the adhesion member 5 on the back surface of the imaging sensor chip 1 of the imaging unit 50. In all verification examples including the verification examples A to F and the comparative verification examples G1 to G4, material physical property values of the adhesion member 5 were the same as one another.

Figure 8:
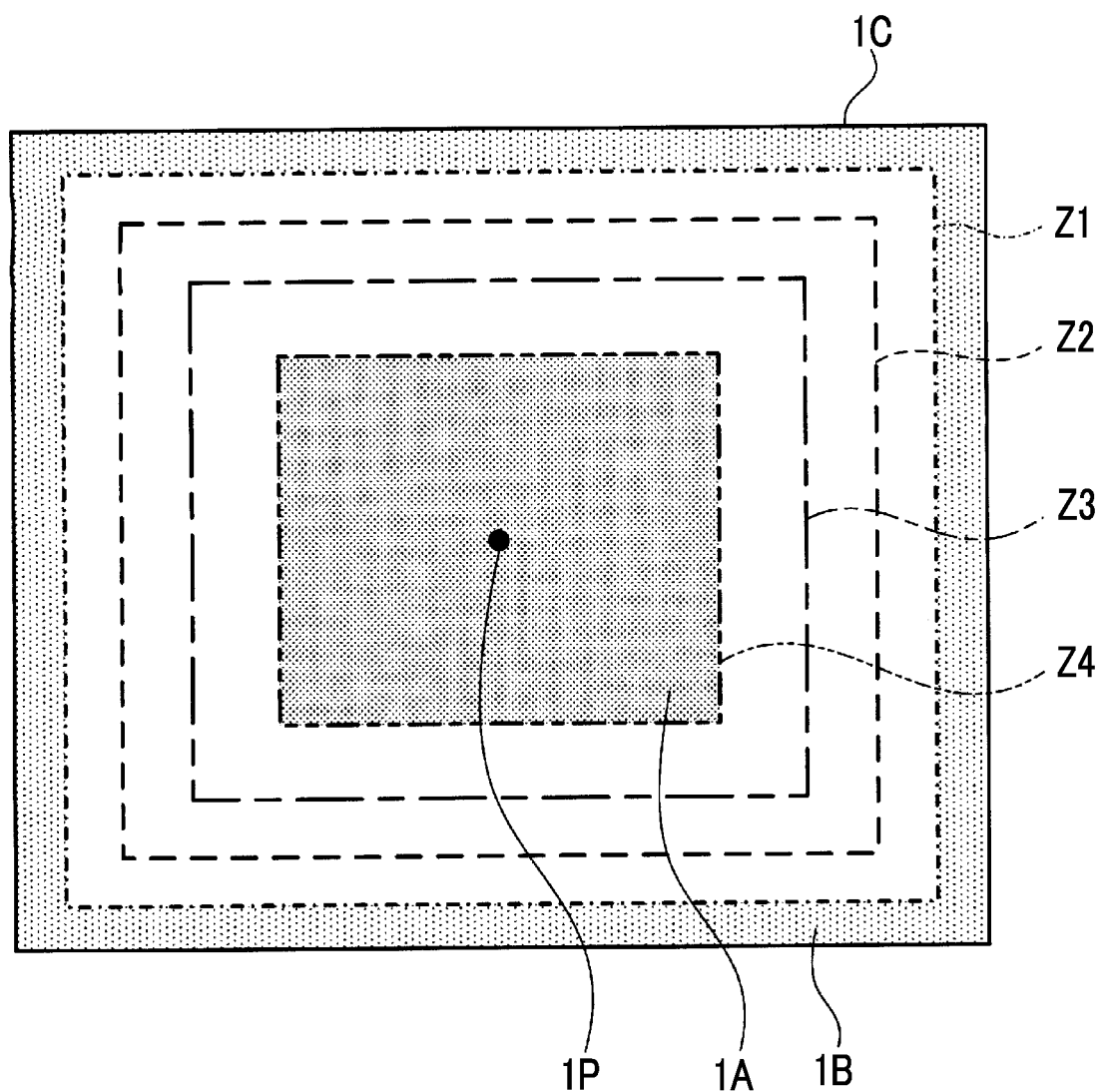
FIG. 8 is a diagram showing a central portion 1A and a peripheral portion 1B set on the back surface of the imaging sensor chip 1 in the imaging unit 50 of a verification example A.

FIG. 8 is a diagram showing the central portion 1A and the peripheral portion 1B set on the back surface of the imaging sensor chip 1 in the imaging unit 50 of the verification example A. In the verification example A, a region inside the rectangular frame Z4 is the central portion 1A, and a region between the rectangular frame Z1 and the peripheral edge 1C is the peripheral portion 1B.

Figure 9:
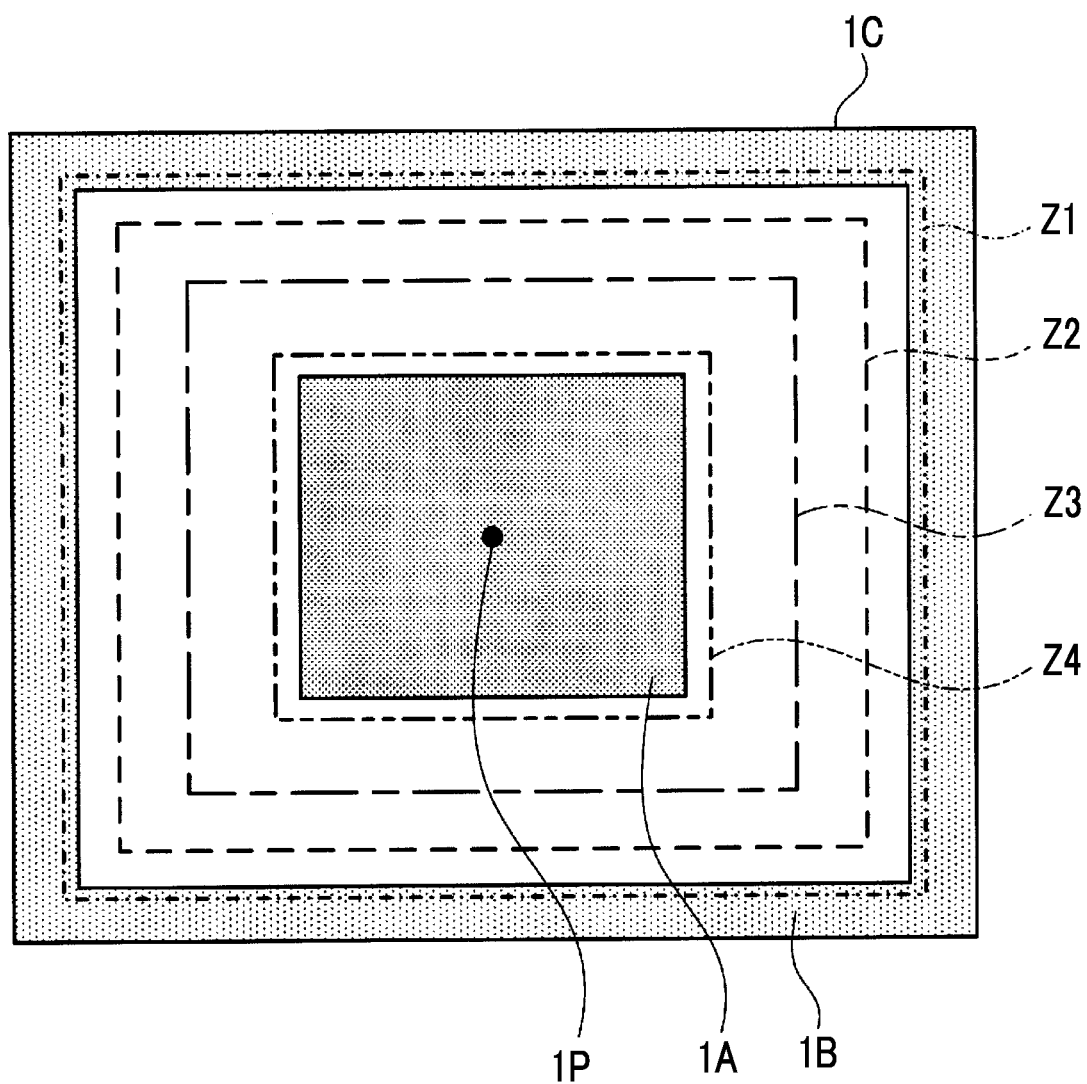
FIG. 9 is a diagram showing a central portion 1A and a peripheral portion 1B set on the back surface of the imaging sensor chip 1 in the imaging unit 50 of a verification example B.

FIG. 9 is a diagram showing the central portion 1A and the peripheral portion 1B set on the back surface of the imaging sensor chip 1 in the imaging unit 50 of the verification example B. The central portion 1A in the verification example B is a reduced configuration of the central portion 1A in the verification example A of FIG. 8. The peripheral portion 1B in the verification example B is an enlarged configuration of the peripheral portion 1B in the verification example A of FIG. 8. A total value of areas of the central portion 1A and the peripheral portion 1B shown in FIG. 9 is set to be the same as a total value of areas of the central portion 1A and the peripheral portion 1B shown in FIG. 8.

An image height at a position of a peripheral edge of the central portion 1A in the verification example B is 35% of the reference image height. An image height at a position of an inner peripheral edge of the peripheral portion 1B in the verification example B is 87% of the reference image height.

Figure 10:
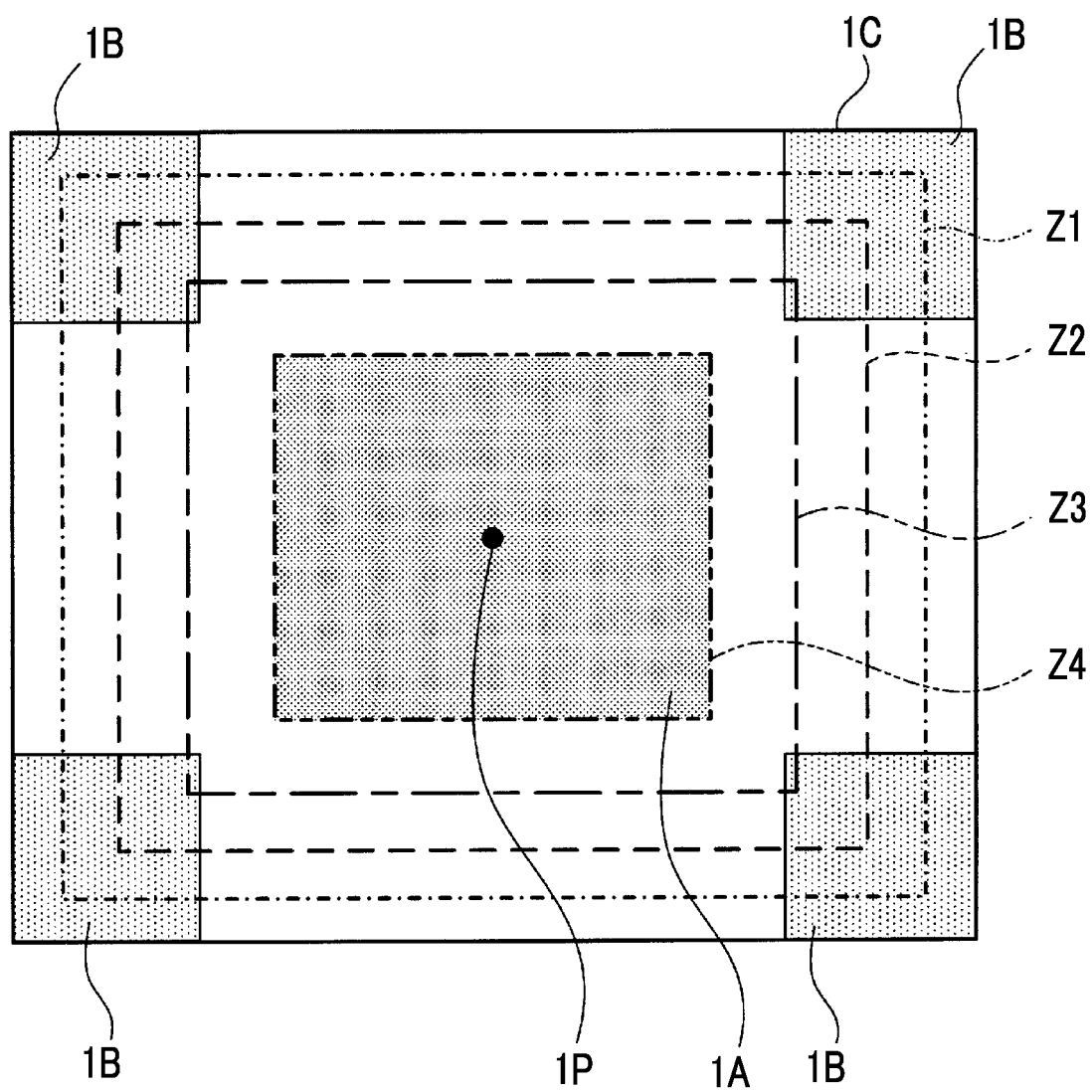
FIG. 10 is a diagram showing a central portion 1A and a peripheral portion 1B set on the back surface of the imaging sensor chip 1 in the imaging unit 50 of a verification example C.

FIG. 10 is a diagram showing the central portion 1A and the peripheral portion 1B set on the back surface of the imaging sensor chip 1 in the imaging unit 50 of the verification example C. In the verification example C, a region inside the rectangular frame Z4 is the central portion 1A, and four corner portions (rectangular regions including corners of peripheral edge 1C) of the imaging sensor chip 1 are the peripheral portions 1B. Each peripheral portion 1B in the verification example C is located on the peripheral edge 1C side from a position where an image height is 63% of the reference image height. A total value of areas of the four peripheral portions 1B shown in FIG. 10 is the same as the area of the peripheral portion 1B of FIG. 8.

Figure 11:
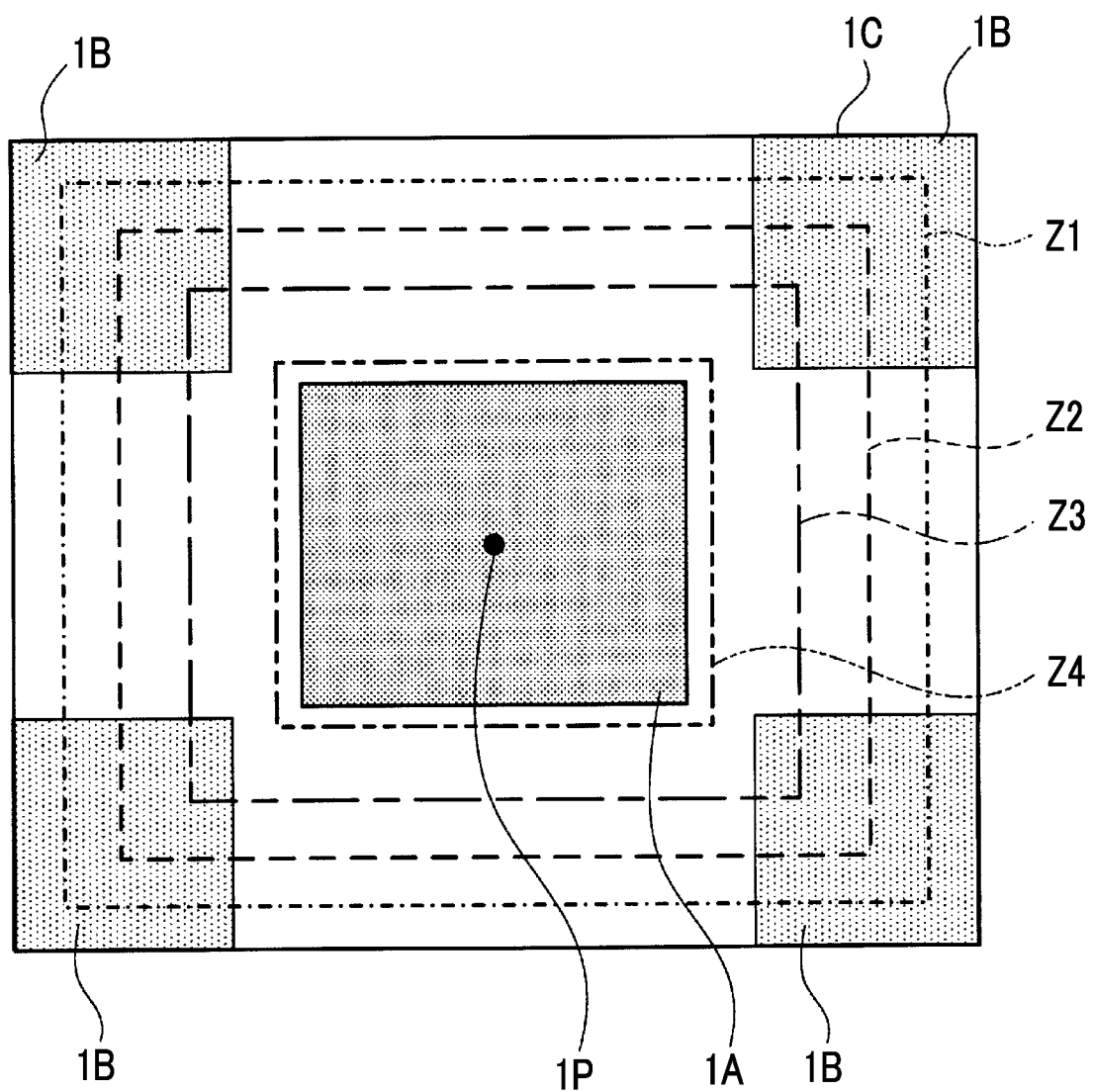
FIG. 11 is a diagram showing a central portion 1A and a peripheral portion 1B set on the back surface of the imaging sensor chip 1 in the imaging unit 50 of a verification example D.

FIG. 11 is a diagram showing the central portion 1A and the peripheral portion 1B set on the back surface of the imaging sensor chip 1 in the imaging unit 50 of the verification example D. The central portion 1A in the verification example D is a reduced configuration of the central portion 1A in the verification example C. The peripheral portion 1B in the verification example D is an enlarged configuration of the peripheral portion 1B in the verification example C. Each peripheral portion 1B in the verification example D is located on the peripheral edge 1C side from a position where an image height is 55% of the reference image height. An image height at a position of a peripheral edge of the central portion 1A in the verification example D is 35% of the reference image height. A total value of areas of the four peripheral portions 1B shown in FIG. 11 is the same as the area of the peripheral portion 1B of FIG. 9.

Figure 12:
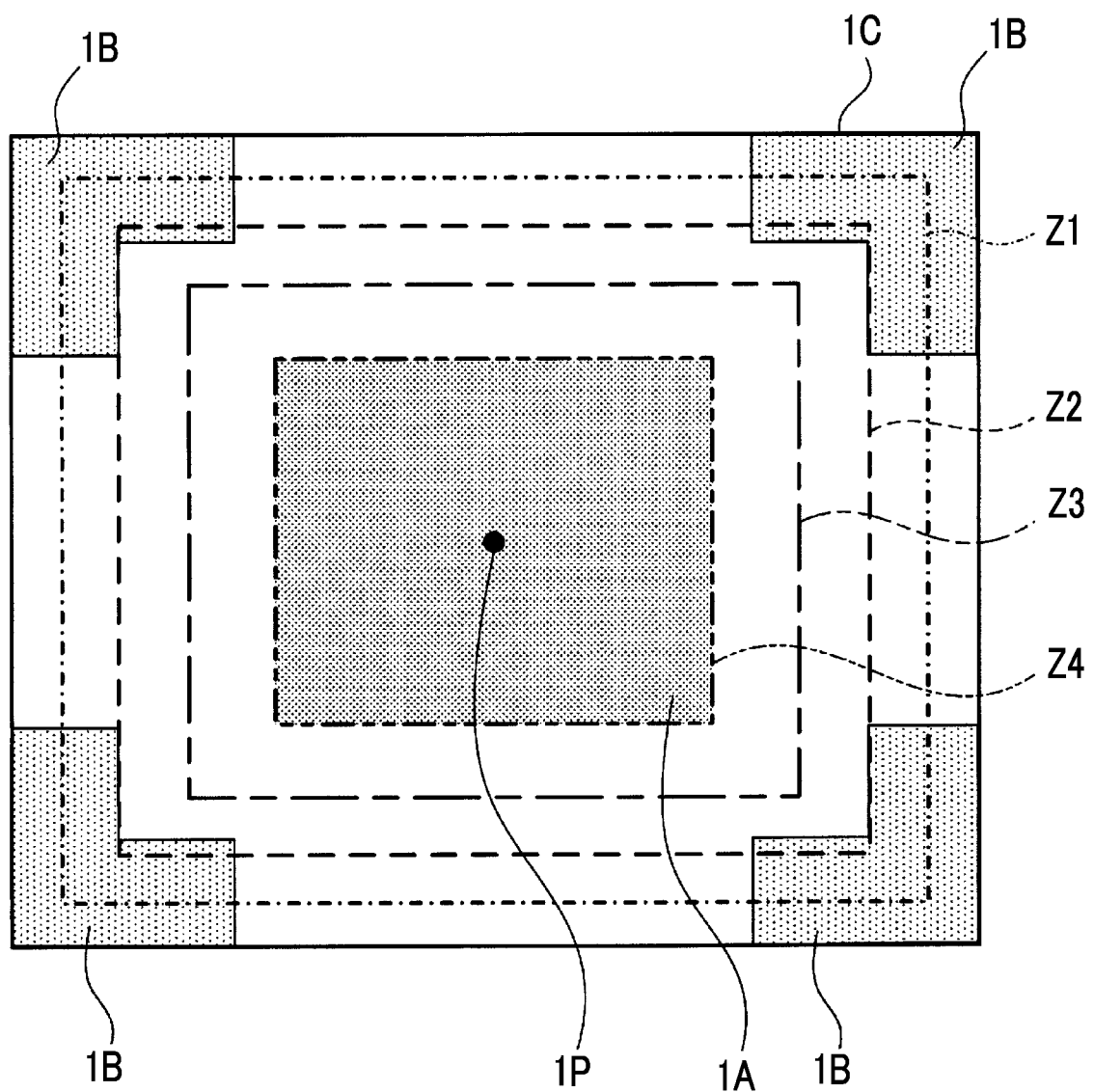
FIG. 12 is a diagram showing a central portion 1A and a peripheral portion 1B set on the back surface of the imaging sensor chip 1 in the imaging unit 50 of a verification example E.

FIG. 12 is a diagram showing the central portion 1A and the peripheral portion 1B set on the back surface of the imaging sensor chip 1 in the imaging unit 50 of the verification example E. In the verification example E, a region inside the rectangular frame Z4 is the central portion 1A, and four corner portions (L-shaped regions including corners of peripheral edge 1C) of the imaging sensor chip 1 are the peripheral portions 1B. Each peripheral portion 1B in the verification example E is located on the peripheral edge 1C side from the rectangular frame Z3. A total value of areas of the four peripheral portions 1B shown in FIG. 12 is the same as the area of the peripheral portion 1B of FIG. 8.

Figure 13:
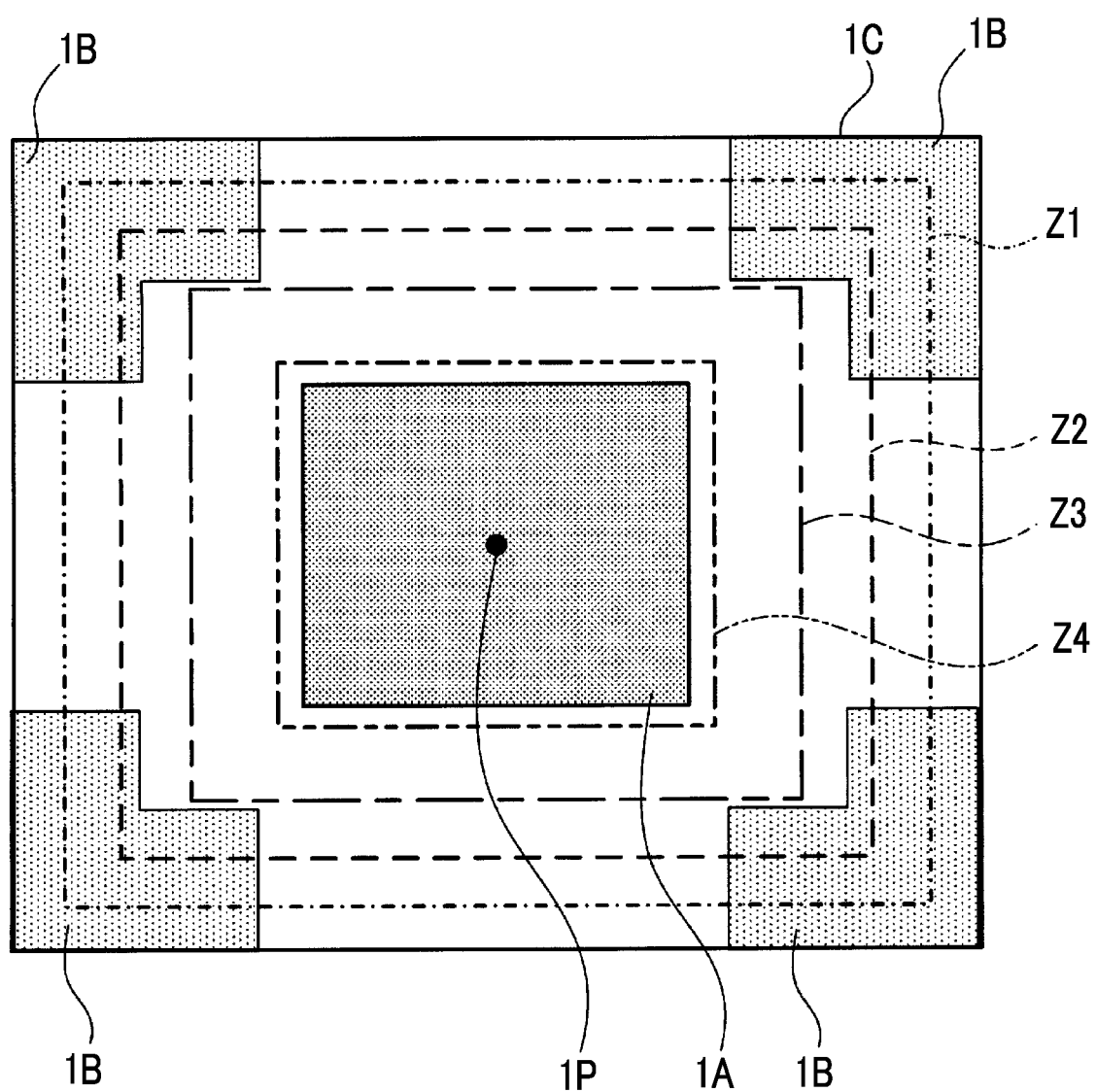
FIG. 13 is a diagram showing a central portion 1A and a peripheral portion 1B set on the back surface of the imaging sensor chip 1 in the imaging unit 50 of a verification example F.

FIG. 13 is a diagram showing the central portion 1A and the peripheral portion 1B set on the back surface of the imaging sensor chip 1 in the imaging unit 50 of the verification example F. The central portion 1A in the verification example F is a reduced configuration of the central portion 1A in the verification example E. The peripheral portion 1B in the verification example F is an enlarged configuration of the peripheral portion 1B in the verification example E. Each peripheral portion 1B in the verification example F is located on the peripheral edge 1C side from the rectangular frame Z3. A total value of areas of the four peripheral portions 1B shown in FIG. 13 is the same as the area of the peripheral portion 1B of FIG. 9.

Figure 14:
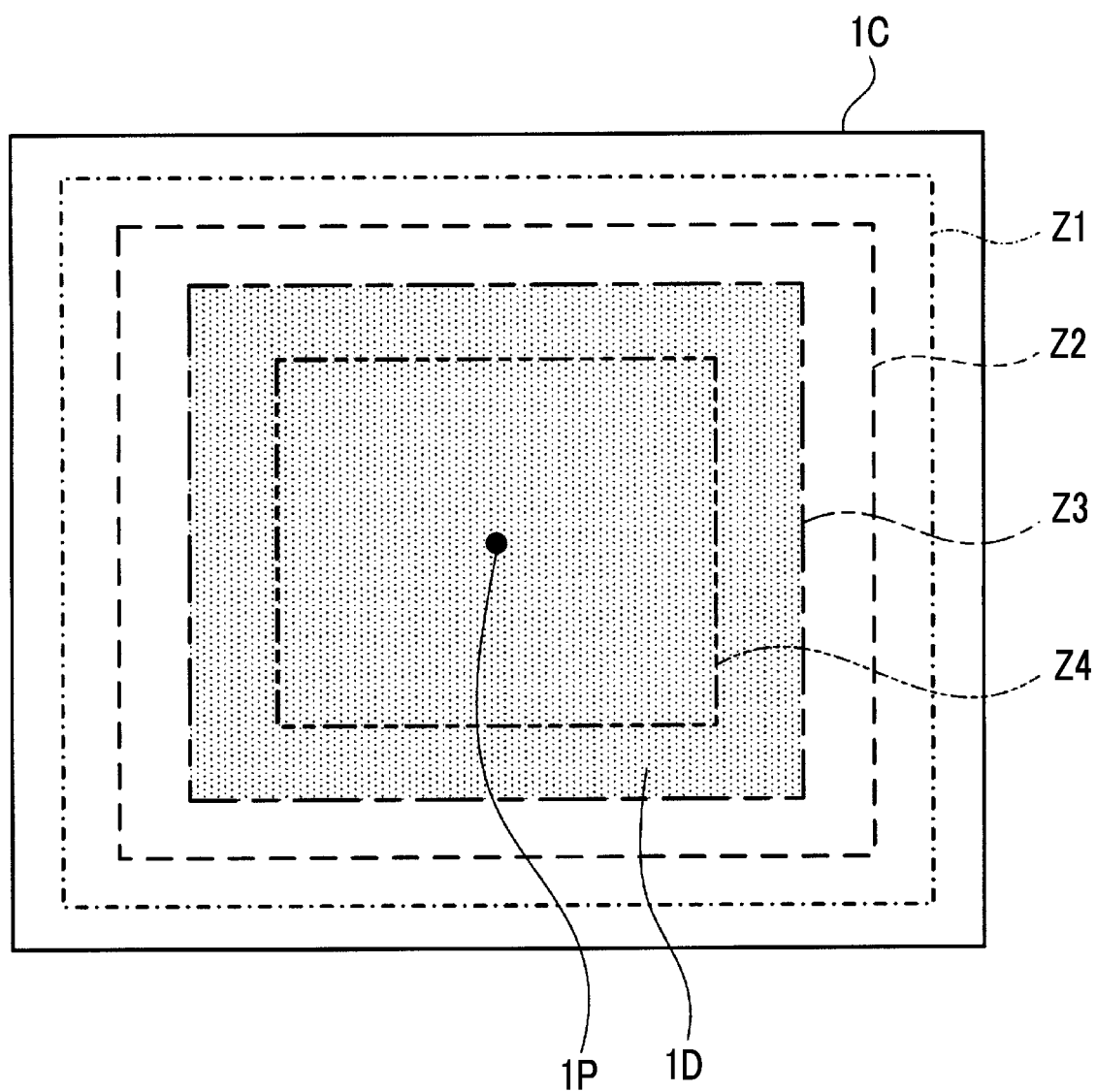
FIG. 14 is a diagram showing an adhesion region with an adhesion member 5 set on the back surface of the imaging sensor chip 1 in the imaging unit 50 of a comparative verification example G1.

FIG. 14 is a diagram showing an adhesion region with the adhesion member 5 set on the back surface of the imaging sensor chip 1 in the imaging unit 50 of the comparative verification example G1. In the comparative verification example G1, only an inner region of the rectangular frame Z3 is an adhesion region 1D adhered to the adhesion member 5. An area of the adhesion region 1D shown in FIG. 14 is set to be the same as a total value of areas of the central portion 1A and the peripheral portion 1B shown in FIG. 8.

Figure 15:
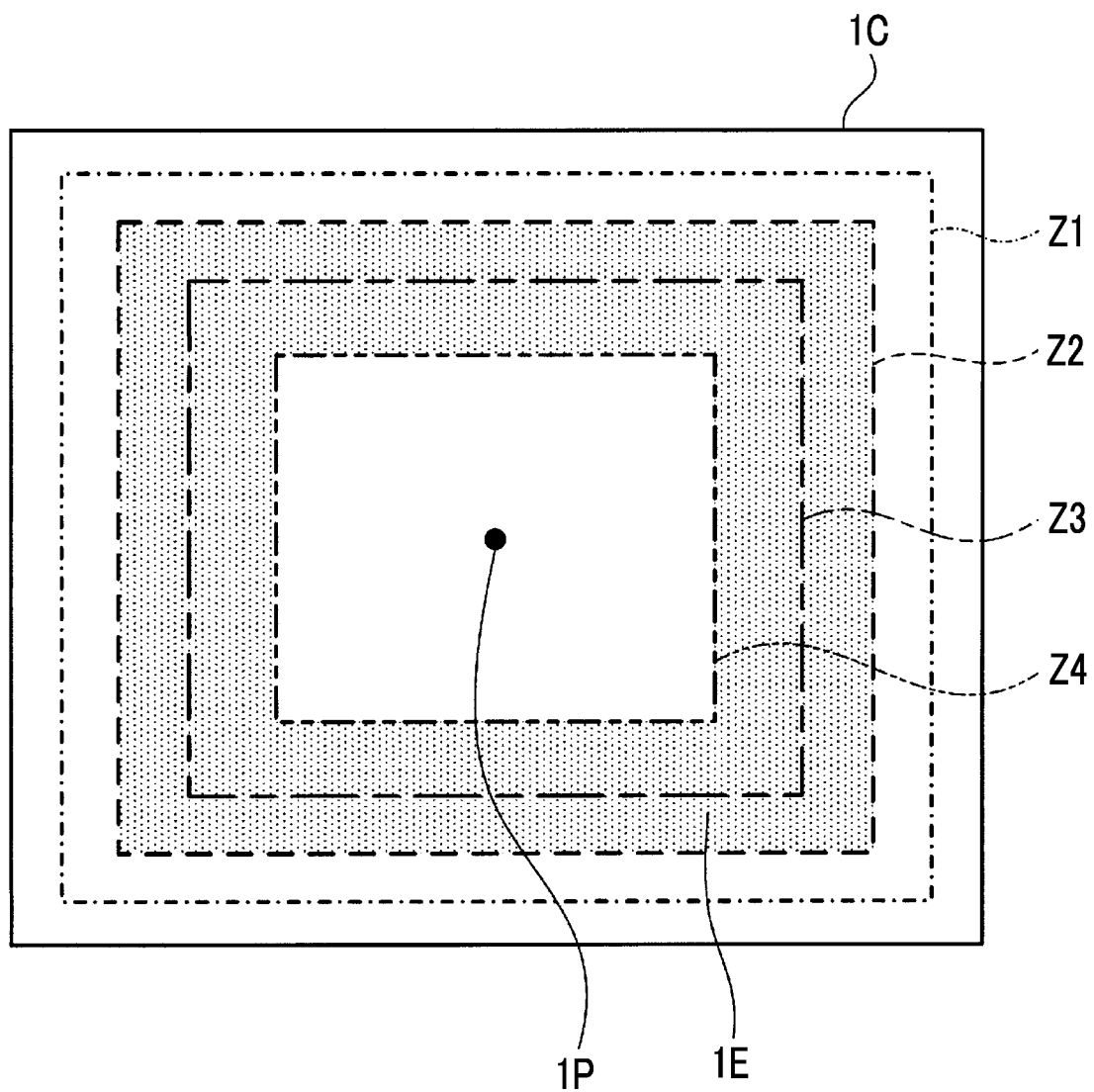
FIG. 15 is a diagram showing an adhesion region with an adhesion member 5 set on the back surface of the imaging sensor chip 1 in the imaging unit 50 of a comparative verification example G2.

FIG. 15 is a diagram showing an adhesion region with the adhesion member 5 set on the back surface of the imaging sensor chip 1 in the imaging unit 50 of the comparative verification example G2. In the comparative verification example G2, only a region between the rectangular frame Z4 and the rectangular frame Z2 is an adhesion region 1E adhered to the adhesion member 5. An area of the adhesion region 1E shown in FIG. 15 is set to be the same as a total value of areas of the central portion 1A and the peripheral portion 1B shown in FIG. 8.

Figure 16:
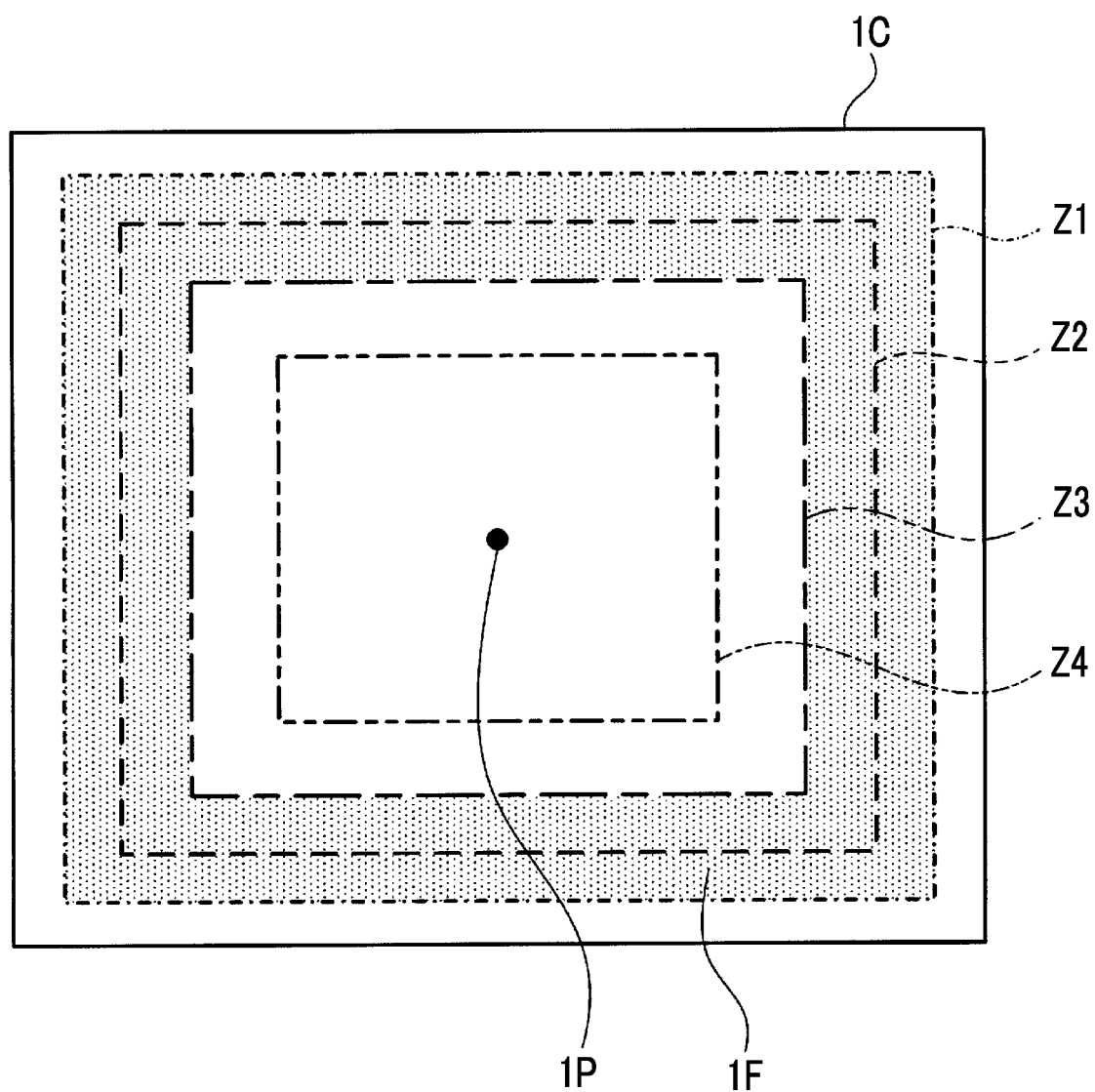
FIG. 16 is a diagram showing an adhesion region with an adhesion member 5 set on the back surface of the imaging sensor chip 1 in the imaging unit 50 of a comparative verification example G3.

FIG. 16 is a diagram showing an adhesion region with the adhesion member 5 set on the back surface of the imaging sensor chip 1 in the imaging unit 50 of the comparative verification example G3. In the comparative verification example G3, only a region between the rectangular frame Z3 and the rectangular frame Z1 is an adhesion region 1F adhered to the adhesion member 5. An area of the adhesion region 1F shown in FIG. 16 is set to be the same as a total value of areas of the central portion 1A and the peripheral portion 1B shown in FIG. 8.

Figure 17:
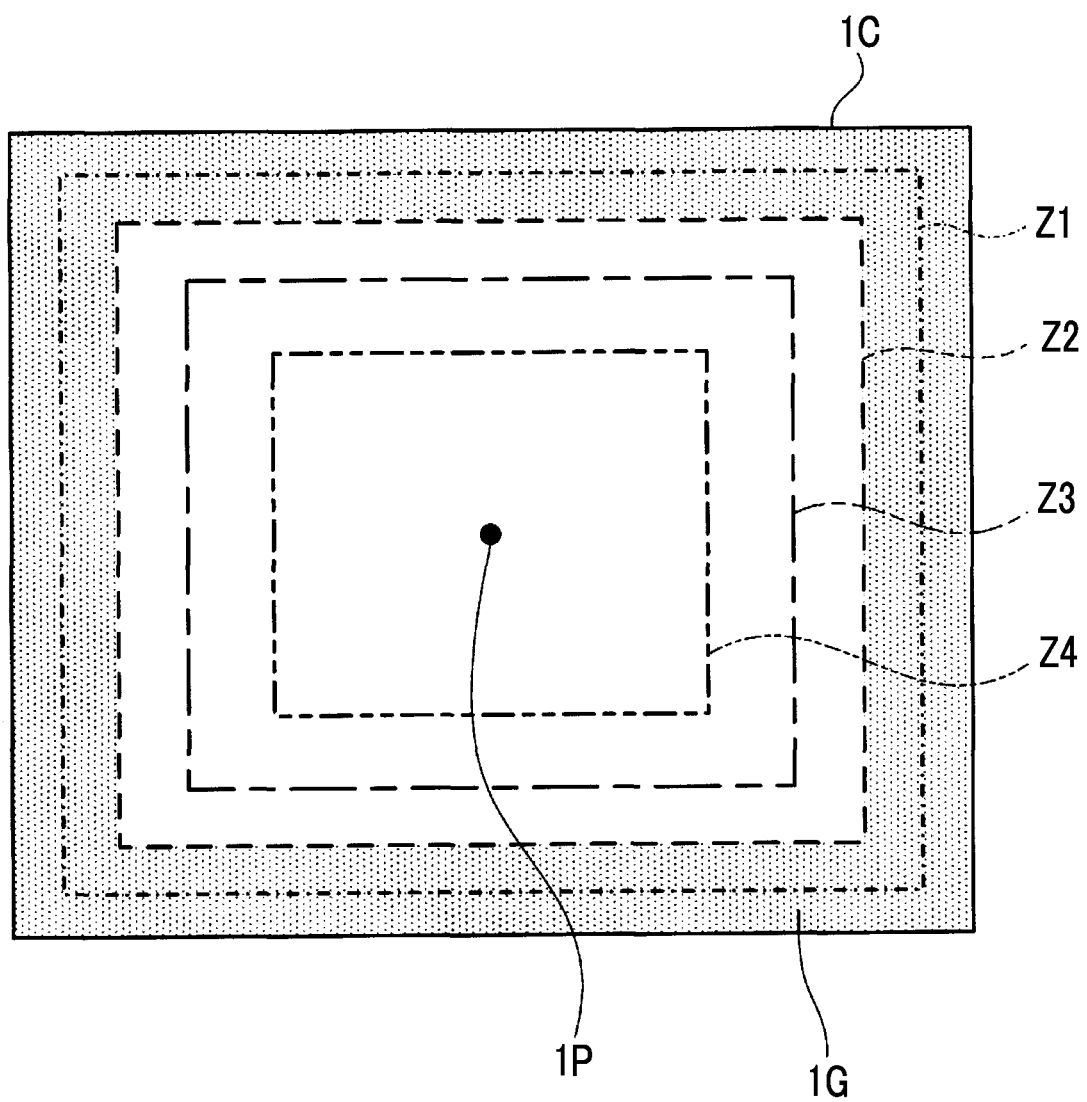
FIG. 17 is a diagram showing an adhesion region with an adhesion member 5 set on the back surface of the imaging sensor chip 1 in the imaging unit 50 of a comparative verification example G4.

FIG. 17 is a diagram showing an adhesion region with the adhesion member 5 set on the back surface of the imaging sensor chip 1 in the imaging unit 50 of the comparative verification example G4. In the comparative verification example G4, only a region between the rectangular frame Z2 and the peripheral edge 1C is an adhesion region 1G adhered to the adhesion member 5. An area of the adhesion region 1G shown in FIG. 17 is set to be the same as a total value of areas of the central portion 1A and the peripheral portion 1B shown in FIG. 8.

Figure 18:
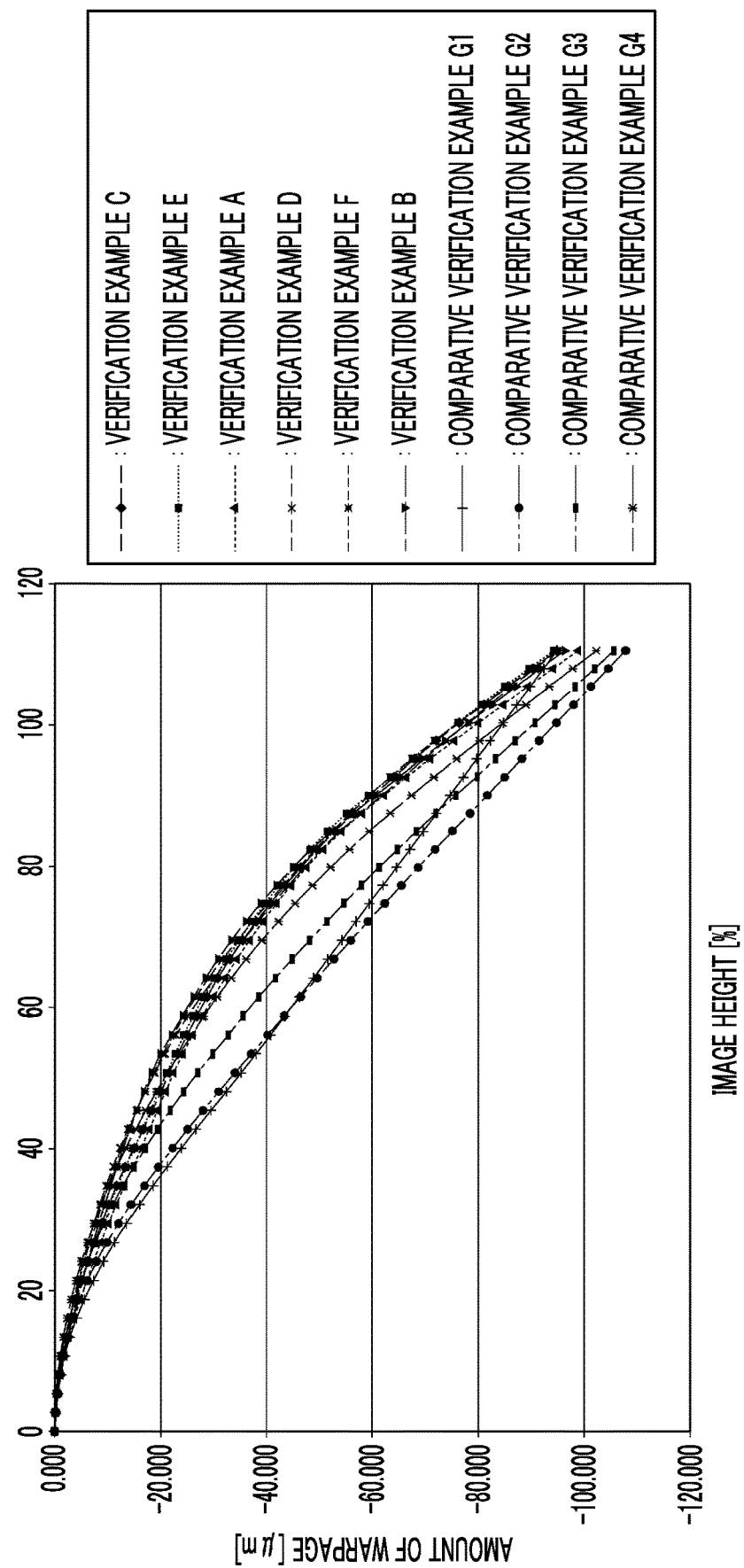
FIG. 18 is a diagram showing simulation results of the amount of warpage of the imaging sensor chip 1 for each image height in the verification examples A to F and the comparative verification examples G1 to G4.

FIG. 18 is a diagram showing simulation results of the amount of warpage of the imaging sensor chip 1 for each image height in the verification examples A to F and the comparative verification examples G1 to G4. A horizontal axis of FIG. 18 indicates the image height percent in a case where the reference image height is 100%. A vertical axis of FIG. 18 indicates the amount of warpage of the imaging sensor chip 1 from the position of the center 1P in a direction perpendicular to the light receiving surface 10.

As shown in FIG. 18, it can be seen that the imaging unit 50 of the verification examples A to F having the central portion 1A and the peripheral portion 1B is, as compared with the imaging unit 50 of the comparative verification example G1 having only the central portion 1A and the imaging unit 50 of the comparative verification examples G2 to G4 having only the frame-shaped adhesion region, capable of suppressing the amount of warpage of the imaging sensor chip 1 as a whole.

Figure 19:
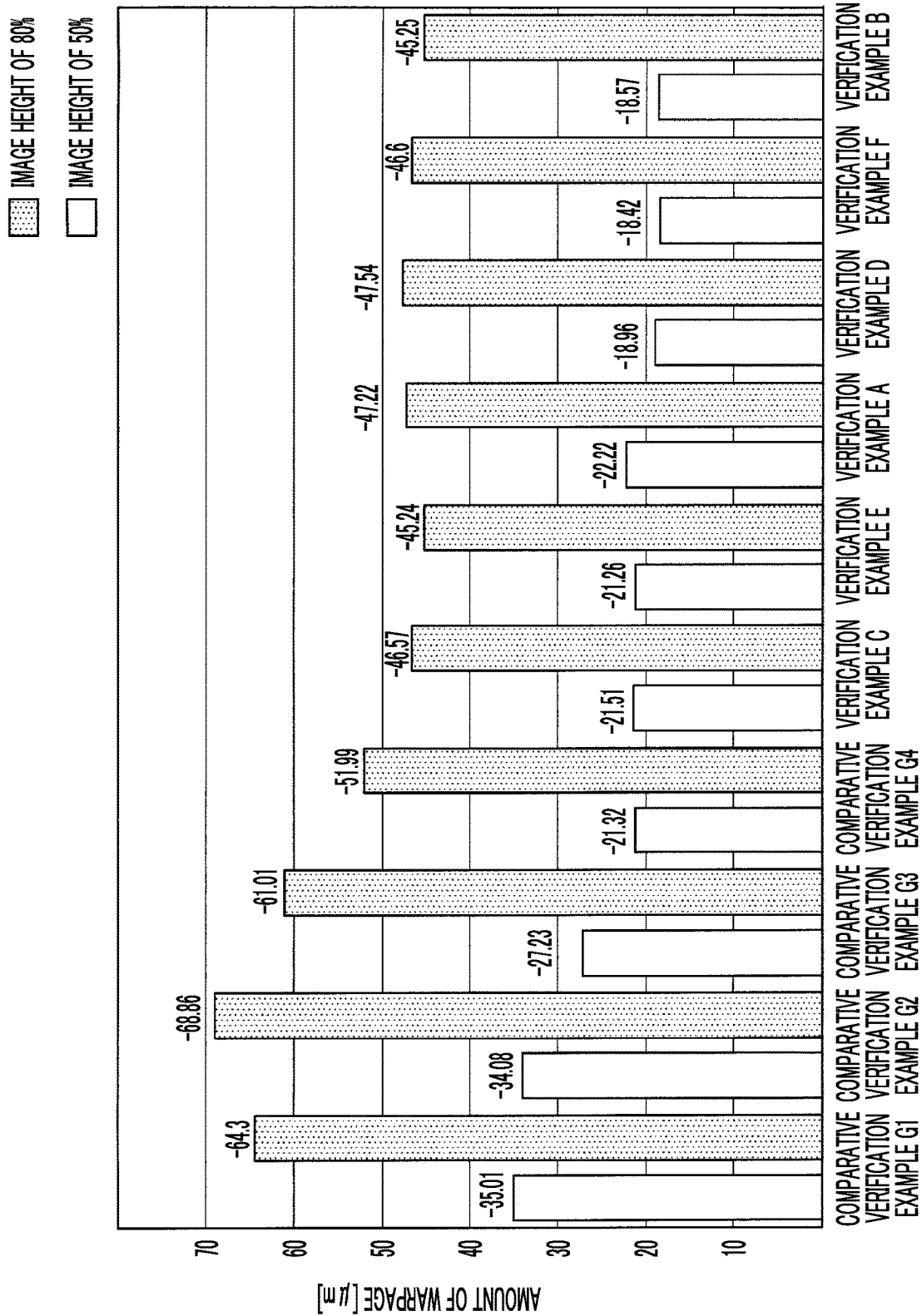
FIG. 19 is a diagram summarizing the amount of warpage of each verification example at an image height of 50% and an image height of 80% among the results shown in FIG. 18.

FIG. 19 is a diagram summarizing the amount of warpage of each verification example at an image height of 50% and an image height of 80% among the results shown in FIG. 18. As shown in FIG. 19, in the imaging unit 50 of the verification examples A to F having the central portion 1A and the peripheral portion 1B, the amount of warpage at an image height of 50% is lower than an allowable upper limit value of 25 µm, and the amount of warpage at an image height of 80% is lower than an allowable upper limit value of 50 µm. As described above, according to the imaging unit 50 of the verification examples A to F, both the amount of warpage at the image height of 50% and the amount of warpage at the image height of 80%, which affect the quality of the captured image, can be set to be equal to or less than the allowable upper limit value, and the deterioration in quality of the captured image can be prevented.

In the verification example A shown in FIG. 8, the central portion 1A is a region inside a position where an image height is 45% of the reference image height, and the peripheral portion 1B is a region from a position where an image height is 92% of the reference image height to the peripheral edge 1C. In addition, in the verification example B shown in FIG. 9, the central portion 1A is a region inside a position where an image height is 35% of the reference image height, and the peripheral portion 1B is a region from a position where an image height is 87% of the reference image height to the peripheral edge 1C. Therefore, from the results of the verification examples A and B shown in FIG. 19, in the configuration shown in FIG. 4, it is proved that the deterioration in quality of the captured image can be effectively prevented in a case where the central portion 1A is located inside a position where an image height is 45% or less of the reference image height, and the peripheral portion 1B is located in a region from a position where an image height is 85% or more of the reference image height to the peripheral edge 1C.

In addition, in the verification example C shown in FIG. 10, the central portion 1A is a region inside a position where an image height is 45% of the reference image height, and the peripheral portion 1B is located in a region from a position where an image height is 63% of the reference image height to the peripheral edge 1C. In addition, in the verification example D shown in FIG. 11, the central portion 1A is a region inside a position where an image height is 35% of the reference image height, and the peripheral portion 1B is located in a region from a position where an image height is 55% of the reference image height to the peripheral edge 1C. In addition, in the verification example E shown in FIG. 12, the central portion 1A is a region inside a position where an image height is 45% of the reference image height, and the peripheral portion 1B is on the peripheral edge 1C side from a position where an image height is 65% of the reference image height. In addition, in the verification example F shown in FIG. 13, the central portion 1A is a region inside a position where an image height is 35% of the reference image height, and the peripheral portion 1B is on the peripheral edge 1C side from a position where an image height is 65% of the reference image height.

Therefore, from the results of the verification examples C to F shown in FIG. 19, in the configurations shown in FIGS. 5 and 6, it is proved that the deterioration in quality of the captured image can be effectively prevented in a case where the central portion 1A is located inside a position where an image height is 45% or less of the reference image height, and the peripheral portion 1B is located in a region from a position where an image height is 55% of the reference image height to the peripheral edge 1C.

Figure 20A:
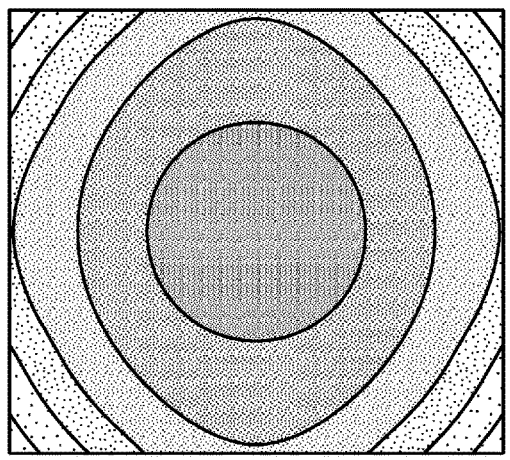
FIGS. 20A to 20C are diagrams each showing a simulation result of warpage distribution in the plane of the imaging sensor chip 1 in the verification examples A, C, and E.
Figure 20B:
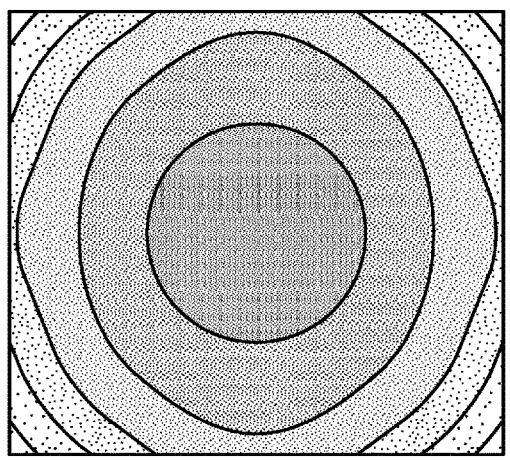
Figure 20C:
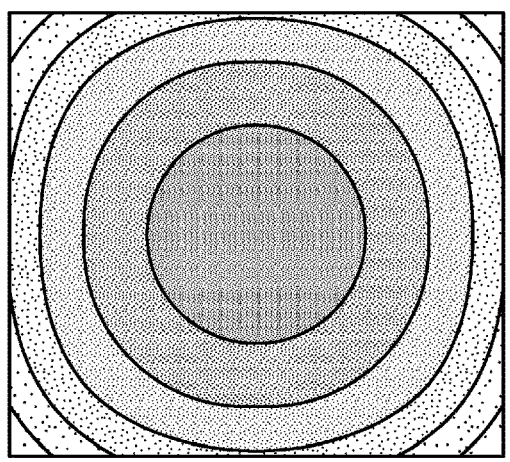
Figure 21A:
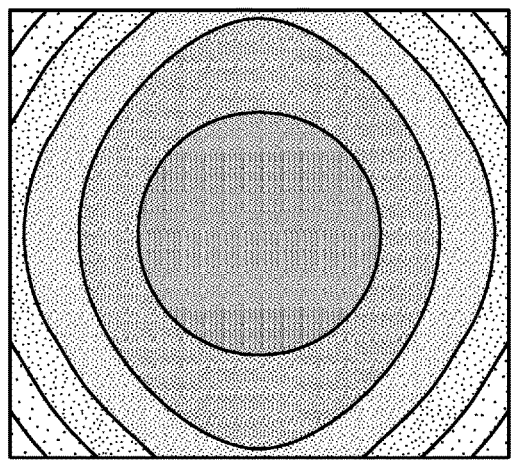
FIGS. 21A to 21C are diagrams each showing a simulation result of warpage distribution in the plane of the imaging sensor chip 1 in the verification examples B, D, and F.
Figure 21B:
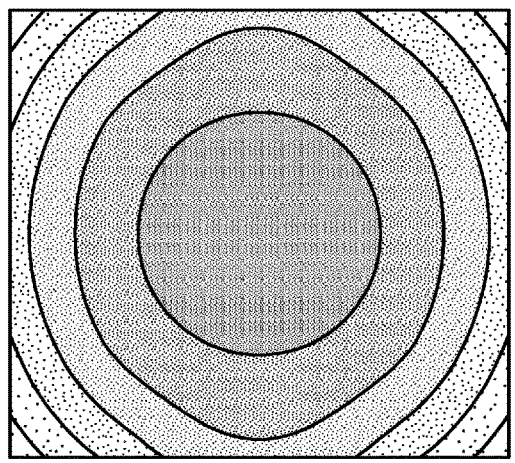
Figure 21C:
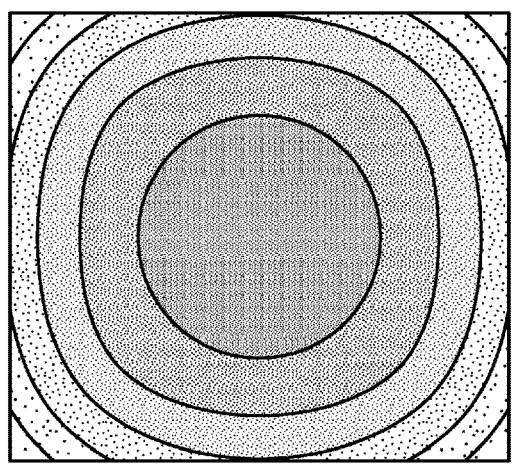

FIGS. 20A to 20C are diagrams each showing a simulation result of warpage distribution in the plane of the imaging sensor chip 1 in the verification examples A, C, and E. FIGS. 21A to 21C are diagrams each showing a simulation result of warpage distribution in the plane of the imaging sensor chip 1 in the verification examples B, D, and F. In FIGS. 20 and 21, the hatched region has a larger amount of warpage as the hatched region has a thinner hatching. In FIGS. 20 and 21, the vertical direction is a direction along one of the two orthogonal sides of the imaging sensor chip 1, and the horizontal direction is a direction along the other side of the two sides of the imaging sensor chip 1.

As shown in FIGS. 20 and 21, according to the configurations of the verification examples A and B, the amount of warpage in the direction along each of the above two sides of the imaging sensor chip 1 can be made substantially equal. Therefore, even though a warpage of the light receiving surface 10 occurs, a high-quality captured image with inconspicuous distortion can be obtained.

As described above, the following items are described in the present specification.

(1)

An imaging unit comprising: an imaging sensor chip; a package substrate on which the imaging sensor chip is mounted; an adhesion member that adheres a back surface of the imaging sensor chip opposite to a light receiving surface and a mounting surface of the package substrate on which the imaging sensor chip is mounted to each other; and a circuit board that is adhered to a back surface of the package substrate opposite to the mounting surface, in which the adhesion member is composed of a central adhesion part adhered to a central portion of the imaging sensor chip and a peripheral adhesion part adhered to a peripheral portion of the imaging sensor chip that is separated from the central portion.

(2)

The imaging unit according to (1),
in which the peripheral portion is an annular region extending along a peripheral edge of the imaging sensor chip.

(3)

The imaging unit according to (2),
in which, in a case where an image height at a position of a peripheral edge of the light receiving surface from a center of the imaging sensor chip is defined as a reference image height, the central portion is a region inside a position where an image height is 45% or less of the reference image height, and the peripheral portion is a region from a position where an image height is 85% or more of the reference image height to the peripheral edge of the imaging sensor chip.

(4)

The imaging unit according to (1),
in which the peripheral portion is four corner portions of the imaging sensor chip.

(5)

The imaging unit according to (4),
in which, in a case where an image height at a position of a peripheral edge of the light receiving surface from a center of the imaging sensor chip is defined as a reference image height, the central portion is a region inside a position where an image height is 45% or less of the reference image height, and the four corner portions are located in a region from the peripheral edge of the imaging sensor chip to a position where an image height is 55% of the reference image height.

(6)

The imaging unit according to (5), in which a total value of areas of the four corner portions in a state of being viewed from a direction perpendicular to the light receiving surface is the same as an area of a region from the peripheral edge of the imaging sensor chip to a position where an image height is 85% or more of the reference image height.

(7)

An imaging device comprising:

the imaging unit according to any one of (1) to (6).

Although various embodiments have been described with reference to the drawings, it goes without saying that the present invention is not limited to such examples. It is obvious that a person skilled in the art is able to find various modification examples and adjustment examples within the scope of the appended claims, and it should be understood that these modification examples and adjustment examples naturally belong to the technical scope of the present invention. Further, the components according to the above-described embodiment may be randomly combined with each other, without departing from the spirit of the invention.

This application is based on Japanese Patent Application filed on Aug. 31, 2018 (JP2018-163210), the content of which is incorporated herein by reference.

The present invention is highly convenient and effective to be applied to an electronic device having an imaging function, such as a digital camera, a smartphone, a tablet terminal, a personal computer, a robot, or an endoscope.

EXPLANATION OF REFERENCES

100: digital camera
11: system control unit
14: operation unit
41: imaging lens
42: stop
43: lens driving unit
44: stop driving unit
45: lens control unit
50: imaging unit
51: imaging sensor
52: circuit board
52a: surface
15: memory control unit
16: main memory
17: digital signal processing unit
20: external memory control unit
21: storage medium
22: display control unit
23: display unit
1: imaging sensor chip
10: light receiving surface
1A: central portion
1B: peripheral portion
1C: peripheral edge
1P: center
1D, 1E, 1F, 1G: adhesion region
Z1: rectangular frame (image height of 92%)
Z2: rectangular frame (image height of 80%)
Z3: rectangular frame (image height of 65%)
Z4: rectangular frame (image height of 45%)
2: package substrate
2a: bottom portion
2b: wall portion
2c: concave portion
2d: bottom surface
2e: rear surface
3: protective cover
4: adhesive
5: adhesion member
5a: central adhesion part
5b: peripheral adhesion part
7: conductive member

What is claimed is:

1. An imaging unit comprising:
an imaging sensor chip;
a package substrate on which the imaging sensor chip is mounted;
an adhesion member that adheres a back surface of a light receiving surface of the imaging sensor chip and a mounting surface of the package substrate on which the imaging sensor chip is mounted to each other; and
a circuit board that is adhered to a back surface of the mounting surface of the package substrate,
wherein the adhesion member includes a central adhesion part adhered to a central portion of the imaging sensor chip and a peripheral adhesion part having an annular shape adhered to a corresponding peripheral portion of the imaging sensor chip that is separated from the central portion, the peripheral portion being an annular region extending along a peripheral edge of the image element chip.

2. The imaging unit according to claim 1,
wherein, in a case where an image height at a position of a peripheral edge of the light receiving surface from a center of the imaging sensor chip is defined as a reference image height, the central portion is a region inside a position where an image height is 45% or less of the reference image height, and the peripheral portion is a region from a position where an image height is 85% or more of the reference image height to the peripheral edge of the imaging sensor chip.

3. The imaging unit according to claim 1,
wherein the peripheral portion includes four corner portions of the imaging sensor chip.

4. The imaging unit according to claim 3,
wherein, in a case where an image height at a position of a peripheral edge of the light receiving surface from a center of the imaging sensor chip is defined as a reference image height, the central portion is a region inside a position where an image height is 45% or less of the reference image height, and the four corner portions are located in a region from the peripheral edge of the imaging sensor chip to a position where an image height is 55% of the reference image height.

5. The imaging unit according to claim 4,
wherein a total value of areas of the four corner portions in a state of being viewed from a direction perpendicular to the light receiving surface is the same as an area of a region from the peripheral edge of the imaging sensor chip to a position where an image height is 85% or more of the reference image height.

6. An imaging device comprising:
the imaging unit according to claim 1.

7. An imaging device comprising:
the imaging unit according to claim 2.

8. An imaging device comprising:
the imaging unit according to claim 3.

9. An imaging device comprising:
the imaging unit according to claim 4.

10. An imaging device comprising:
the imaging unit according to claim 5.

* * * * *